(12) United States Patent
Lee et al.

(10) Patent No.: US 7,746,249 B2
(45) Date of Patent: Jun. 29, 2010

(54) METHOD AND APPARATUS FOR ENCODING AND DECODING KEY DATA

(75) Inventors: Shin-jun Lee, Seoul (KR); Seok-yoon Jung, Seoul (KR); Euee-seon Jang, Seoul (KR); Sang-oak Woo, Anyang (KR); Mahn-jin Han, Seongnam (KR); Do-kyoon Kim, Seongnam (KR); Gyeong-ja Jang, Goyang (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1128 days.

(21) Appl. No.: 11/390,337

(22) Filed: Mar. 28, 2006

(65) Prior Publication Data

US 2006/0171533 A1 Aug. 3, 2006

Related U.S. Application Data

(63) Continuation of application No. 10/305,016, filed on Nov. 27, 2002, now Pat. No. 7,026,960.

(30) Foreign Application Priority Data

Oct. 19, 2002 (KR) ............... 10-2002-0064007
Oct. 19, 2002 (KR) ............... 2002-64007

(51) Int. Cl.
*H03M 7/00* (2006.01)
(52) U.S. Cl. ................................ 341/50; 382/243
(58) Field of Classification Search ............... 341/50, 341/78; 345/273; 707/100; 382/243
See application file for complete search history.

(56) References Cited

U.S. PATENT DOCUMENTS 5,379,357 A 1/1995 Sentsui et al.
(Continued)

OTHER PUBLICATIONS

Bourges-Sevenier, Mikael et al., Animation framework for MPEG-4 systems, Multimedia and Expo, 2000, ICME 2000, 2000 IEEE International Conference on New York, NY, Jul. 2000, pp. 1115-1118, vol. 2, Piscataway, NJ.

(Continued)

*Primary Examiner*—Peguy JeanPierre
(74) *Attorney, Agent, or Firm*—Staas & Halsey LLP

(57) ABSTRACT

An apparatus and a method for encoding and decoding key data are provided. An apparatus for encoding DPCMed differential data of key data includes a DND operator which performs on input differential data a predetermined number of times a DND operation, in which a divide operation is performed on the input differential data so as to divide differential data belonging to a positive number region into halves and so as to convert one half of the differential data belonging to an upper range than the other half into negative values, and either a divide-up operation or a divide-down operation is selectively performed on the results of the divide operation depending on the range of the results of the divide operation so as to reduce the range of differential data belonging to a negative number region or the positive number region, respectively, a shift-up operator which performs a shift-up operation on the results of the DND operation so as to transfer the differential data having been through the DND operation to either the positive or negative number region, a differential data selector which selectively outputs either the differential data having been through the DND operation or the differential data having been through the shift-up operation, and an entropy encoder which entropy-encodes the differential data selected by the differential data selector.

22 Claims, 33 Drawing Sheets

U.S. PATENT DOCUMENTS

| | | | |
|---|---|---|---|
| 5,692,117 | A | 11/1997 | Berend et al. |
| 5,818,463 | A | 10/1998 | Tao et al. |
| 5,901,248 | A | 5/1999 | Fandrianto et al. |
| 6,075,901 | A | 6/2000 | Signes et al. |
| 6,151,073 | A | 11/2000 | Steinberg et al. |
| 6,441,842 | B1 | 8/2002 | Fandrianto et al. |
| 6,559,848 | B2 | 5/2003 | O'Rourke |
| 6,847,365 | B1 | 1/2005 | Miller et al. |
| 2003/0103573 | A1 | 6/2003 | Lee et al. |
| 2003/0108107 | A1 | 6/2003 | Kim et al. |
| 2003/0128215 | A1* | 7/2003 | Kim et al. .................. 345/473 |
| 2003/0128884 | A1 | 7/2003 | Lee et al. |
| 2003/0147470 | A1 | 8/2003 | Lee et al. |

OTHER PUBLICATIONS

Kim, James D.K. et al., "Animation Data Compression in MPEG-4:Interpolators," Proceedings 2002 International Conference on Image Processing, ICIP 2002, Sep. 22, 2002, pp. 33-36, vol. 2, New York, NY.

Lu, Chung H. et al., "A DPCM System with Modulo Limiters," Communications for the Information Age, Proceedings of the Global Telecommunications Conference and Exhibition (Globecom), IEEE, Nov. 28, 1988, pp. 581-585, vol. 1, New York.

Partial European Search Report, Jan. 2006.

First Official Action issued by the Chinese Patent Office in CN Application No. 200410055815.6 on Feb. 10, 2006, and English translation thereof.

Kim et al., "Result of Core Experiment on Interpolator Compression", Samsung AIT, MPEG01/M7774, Dec. 2001, 56 pgs.

Kim et al., "A Proposal for Interpolator Compression", Samsung AIT, MPEG01/M7473, Jul. 2001, 29 pgs.

Bohlender, "Decimal Floating-Point Arithmetic in Binary Representation", Computer Arithmetic, Scientific Publishing Co., IMACS, 1991, pp. 13-27.

European Search Report for corresponding European Patent Application No.: 06122709.6 dated Jun. 24, 2009, 7 pgs (in English).

* cited by examiner

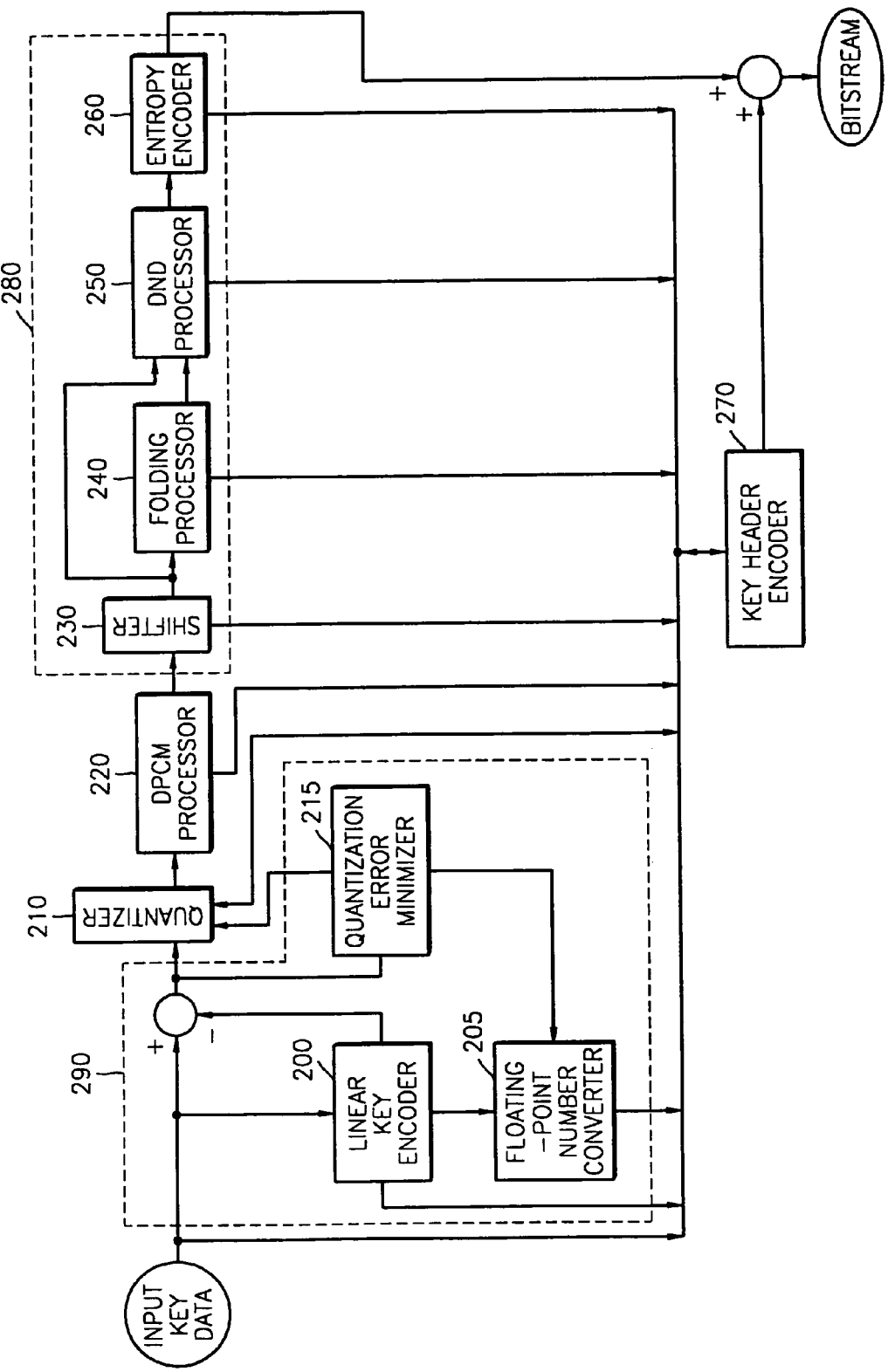

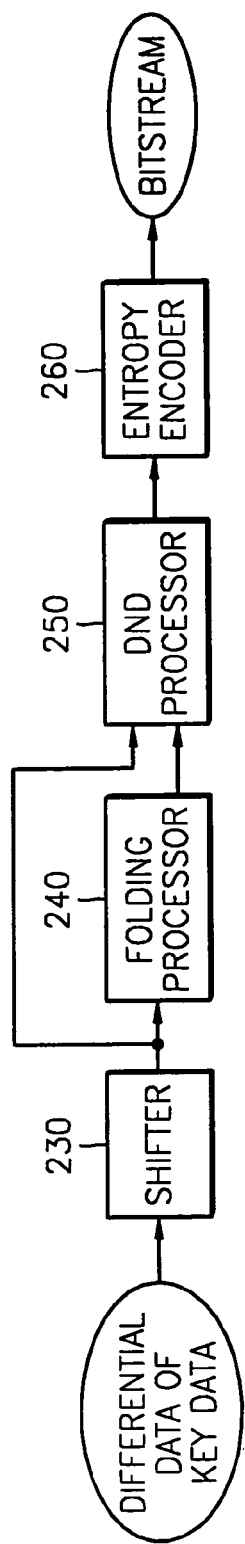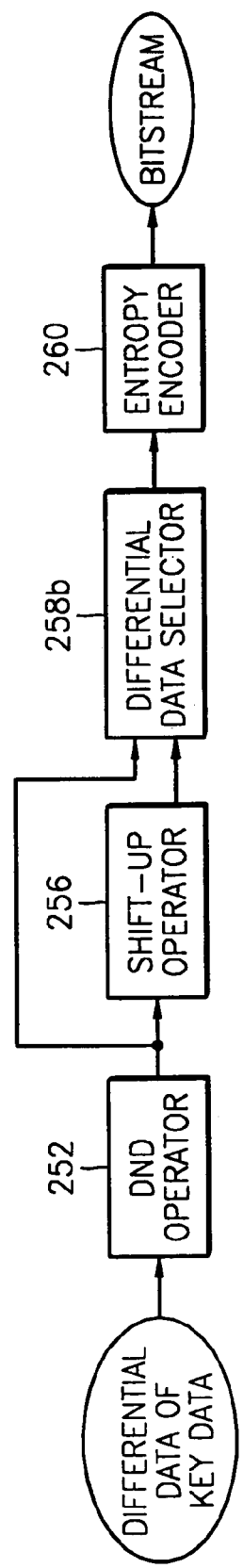

FIG. 8
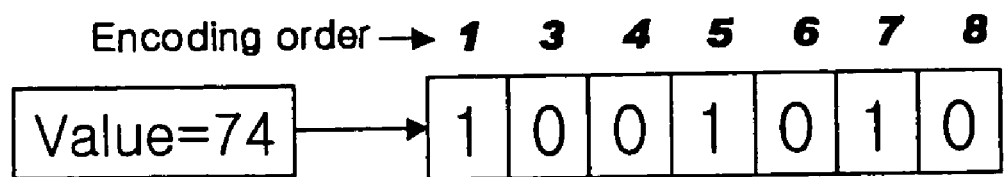
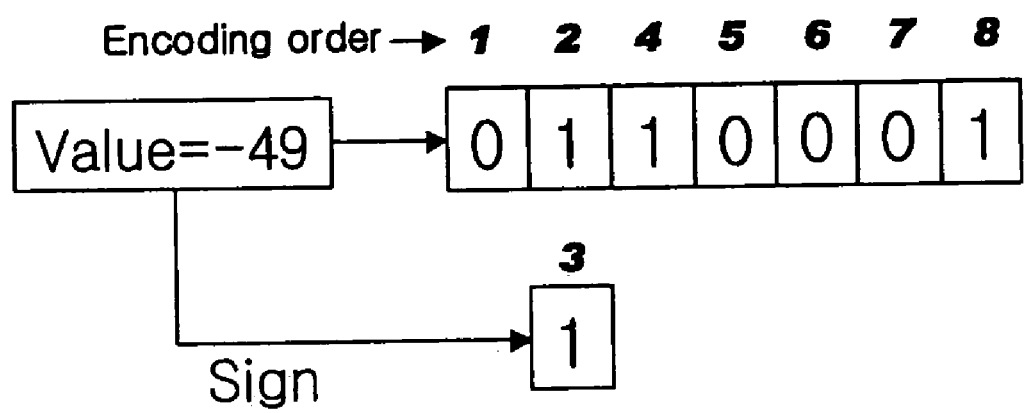

FOLD

DIVIDE

SHIFT-UP

FINAL

| ORIGINAL POINTS | P0 | P1 | P2 | P3 | P4 | P5 | P6 | P7 | P8 |
|---|---|---|---|---|---|---|---|---|---|
| KEY SELECTION FLAG | 1 | 0 | 0 | 1 | 0 | 0 | 1 | 0 | 1 |

FIG. 14A

```
class KeyHeader {
        int i;
        unsigned int(5) nKeyQBit;
        unsigned int(5) nNumKeyCodingBit;
        unsigned int(nNumKeyCodingBit) nNumberOfKey;
        unsigned int(4) nKeyDigit;
        bit(1) bIsLinearKeySubRegion;
        if(bIsLinearKeySubRegion == 1)
                LinearKey lKey(nKeyDigit);
        bit(1) bRangeFlag;
        if(bRangeFlag == 1)
                KeyMinMax keyMinMax(nKeyDigit);
        unsigned int(5) nBitSize;
        unsigned int(2) nKDPCMOrder;
        for(i = 0; i < nKDPCMOrder + 1; i++) {
                bit(1) nQIntraKeySign[[i]];
                if(i == 0 && nQIntraKeySign[i] == 1)
                        continue;
                unsigned int(nBitSize) nQIntraKey[[i]];
        }
        bit(1) bShiftFlag;
        if(bShiftFlag == 1) {
                bit(1) nKeyShiftSign;
                unsigned int(nBitSize) nKeyShift;
        }
        unsigned int(3) nDNDOrder;
        if(nDNDOrder == 7) {
                bit(1) bNoDND;
                if(bNoDND == 1)
                        nDNDOrder = -1;
        }
        int nMaxQBit = nBitSize;
        for(i = 0; i < nDNDOrder; i++) {
                bit(1) nKeyMaxSign[[i]];
                unsigned int(nMaxQBit) nKeyMax[[i]];
                nMaxQBit = (int)(log10(abs(nKeyMax[i]))/log10(2))+1;
                if(nMaxQBit+1 < nBitSize)
                        nMaxQBit += 1;
                else
                        nMaxQBit = nBitSize;
        }
        int bSignedAACFlag;
        int nKeyCodingBitQBit = (int)(log10(nKeyQBit))/log10(2))+1;
        unsigned int(nKeyCodingBitQBit) nKeyCodingBit;
        if(nDNDOrder != -1 && nDNDOrder != 0) {
                bit(1) bKeyInvertDownFlag;
                if(bKeyInvertDownFlag == 1) {
                        unsigned int(nKeyCodingBit) nKeyInvertDown;
                        bSignedAACFlag = 0;
                } else {
                        bSignedAACFlag = 1;
                }
        } else {
                bSignedAACFlag = 0;
        }
}
```

FIG. 14B

```
class LinearKey (int nKeyDigit) {
    unsigned int(5) nNumLinearKeyCodingBit;
    unsigned int(nNumLinearKeyCodingBit) nNumberOfLinearKey;
    KeyMinMax kMinMax(nKeyDigit);
}
```

FIG. 14C

```
class KeySelectionFlag(KeyHeader kHeader, int bPreserveKey) {
    int i;
    int nNumOfKeyValue = 0;
    if(bPreserveKey == 1) {
        for(i=0; i<kHeader.nNumberOfKey; i++) {
            qf_decode(&keyFlag[i], keyFlagContext);
            if(keyFlag[i] == 1)
                nNumOfKeyValue++;
        }
    } else
        nNumOfKeyValue = kHeader.nNumberOfKey;
}
```

FIG. 14D

```
class KeyMinMax (int nKeyDigit) {
    bit(1) bMinKeyDigitSame;
    if((bMinKeyDigitSame == 0)
            unsigned int(4) nMinKeyDigit;
    else
            nMinKeyDigit = nKeyDigit;
    if(nMinKeyDigit != 0) {
            if(nMinKeyDigit < 8) {
                    int count = (int)(log10(10^nMinKeyDigit-1)/log10(2)) + 1;
                    bit(1) nMinKeyMantissaSign;
                    unsigned int(count) nMinKeyMantissa;
                    bit(1) nMinKeyExponentSign;
                    unsigned int(6) nMinKeyExponent;
            } else
                    float(32) fKeyMin;
    }
    bit(1) bMaxKeyDigitSame;
    if(bMaxKeyDigitSame == 0)
            unsigned int(4) nMaxKeyDigit;
    else
            nMaxKeyDigit = nKeyDigit;
    if(nMaxKeyDigit != 0) {
            if(nMaxKeyDigit < 8) {
                    int count = (int)(log10(10^nMaxKeyDigit)-1)/log10(2)) + 1;
                    bit(1) nMaxKeyMantissaSign;
                    unsigned int(count) nMaxKeyMantissa;
                    bit(1) bSameExponent;
                    if(bSameExponent == 0) {
                            bit(1) nMaxKeyExponentSign;
                            unsigned int(6) nMaxKeyExponent;
                    }
                    else
                            nMaxKeyExponent = nMinKeyExponent;
            } else
                    float(32) fKeyMax;
    }
}
```

FIG. 14E

```
class Key (KeyHeader kHeader) {
        int nQKey[kHeader.nNumberOfKey];
        int i;
        int nNumberOfRemainingKey;
        if(kHeader.bIsLinearKeySubRegion == 1)
                nNumberOfRemainingKey = kHeader.nNumberOfKey
                kHeader.lKey.nNumberOfLinearKey;
        else
                nNumberOfRemainingKey = kHeader.nNumberOfKey;
        for(i = kHeader.nKDPCMOrder+1; i < nNumberOfRemainingKey; i++) {
                if(kHeader.bSignedAACFlag == 0)
                        decodeUnsignedAAC(nQKey[i], kHeader.nKeyCodingBit, keyContext);
                else
                        decodeSignedAAC(nQKey[i], kHeader.nKeyCodingBit+1, keySignContext,
                        keyContext);
        }
}
```

FIG. 15A

```
void decodeSignedAAC(int *nDecodedValue, int qstep, QState *signContext,
QState *valueContext) {
    int b;
    b = qstep - 2;
    int msb = 0;
    do {
        qf_decode(&msb, &valueContext[b]);
        msb = msb << b;
        b--;
    } while (msb == 0 && b >=0);
    int sgn = 0;
    int rest = 0;
    if(msb != 0) {
        qf_decode(&sgn, signContext);
        while (b >= 0) {
            int temp = 0;
            qf_decode(&temp, &valueContext[b]);
            rest |= (temp << b);
            b--;
        }
    }
    if(sgn)
        *nDecodedValue = -(msb+rest);
    else
        *nDecodedValue = (msb+rest);
}
```

FIG. 15B

```c
void decodeUnsignedAAC(int *nDecodedValue, int qstep,
QState *valueContext) {
    int b;
    b = qstep - 1;
    int msb = 0;
    do {
        qf_decode(&msb, &valueContext[b]);
        msb = msb << b;
        b--;
    } while (msb == 0 && b >= 0);
    int rest = 0;
    if(msb != 0) {
        while (b >= 0) {
            int temp = 0;
            qf_decode(&temp, &valueContext[b]);
            rest |= (temp << b);
            b--;
        }
    }
    *nDecodedValue = (msb + rest);
}
```

FIG. 15C

```
void decodeKey(int* nQIntraKey, int* nQKey, int nNumberOfRemainingKey,
int nKeyQBit)
{
        add(nQKey, nQIntraKey);              // add nQIntraKey array to nQKey array
// Inverse DND
        if(m_nDNDOrder > 0) {
                if(nKeyInvertDown != -1) {
                        for(k = 0; k < nNumberOfRemainingKey; k++)
                                invert-down(nQKey[k], nKeyInvertDown);
                }
                for(i = nDNDOrder; i > 0; i--) {
                        if(nKeyMax[i-1] >= 0) {
                                if(i == 1) {
                                        for(k = 0; k < nNumberOfRemainingKey; k++)
                                                inverse-divide(nQKey[k], nKeyMax[i-1]);
                                }
                                else {
                                        for(k = 0; k < nNumberOfRemainingKey; k++)
                                                inverse-divide-down(nQKey[k], nKeyMax[i-1]);
                                }
                        } else {
                                for(k = 0; k < nNumberOfRemainingKey; k++)
                                        inverse-divide-up(nQKey[k], nKeyMax[i-1]);
                        }
                }
        }
        //Inverse Fold
        if(nDNDOrder != -1) {
                for(k = 0; k < nNumberOfRemainingKey; k++)
                        inverse-fold(nQKey[k])
        }
        for(k = 0; k < nNumberOfRemainingKey; k++)
                inverse-shift(nQKey[k], nKeyShift)    //Inverse Shift for(i = 0; i < nKDPCMOrder; i++)      //Inverse DPCM
                inverse-dpcm(nQKey, nNumberOfRemainingKey);
        //Inverse Quantization
        inverse-quantize(nQKey, nNumberOfRemaingKey, nKeyQBit);
}
```

METHOD AND APPARATUS FOR ENCODING AND DECODING KEY DATA

This application claims the priority of Korean Patent Application No. 2002-64007, filed Oct. 19, 2002, in the Korean Intellectual Property Office. This application also claims the benefit of U.S. Provisional Application No. 60/333,130, filed Nov. 27, 2001; U.S. Provisional Application No. 60/334,541, filed Dec. 3, 2001; U.S. Provisional Application No. 60/342,101, filed Dec. 26, 2001; and U.S. Provisional Application No. 60/369,597, filed Apr. 4, 2002. The entire contents of these applications are incorporated herein by reference.

BACKGROUND OF THE INVENTION

1. Field of the Invention

The present invention relates to a method and an apparatus for encoding and decoding key data, and more particularly, to an apparatus and a method for encoding key data which are capable of increasing the efficiency of encoding key data by generating differential data performing differential pulse code modulation (DPCM) on key data and by decreasing the range of the differential data to be encoded performing predetermined operations, and to an apparatus and a method for decoding encoded key data.

2. Description of the Related Art

Three-dimensional (3D) representation has been widely used for 3D computer games or a virtual reality environment in a computer system. A virtual reality modeling language (VRML) is used to represent 3D animation.

VRML and MPEG-4 binary format for scene (BIFS) provide an animation representation method based on key framing. In the animation representation method, predetermined key frames are arranged on an arbitrary time axis, and animation data between the key frames are filled by linear interpolation. The key frames are defined by interpolator nodes, and each of the interpolator node is represented by a floating-point number within a predetermined range, for example, a range from −∞ to +∞. Each of the interpolator nodes constitutes fields each consisting of key data representing the position of a certain key frame on the time axis and key value data representing the characteristics and movement information on the key data corresponding to the key data.

In order to represent animation as naturally and smoothly as the movement of a real object by using key framing, which is a piecewise linear interpolation, a considerable amount of key frame information must be provided via each of the interpolator nodes, the fact which causes serious problems in terms of computational costs and efficiency. In the event where key framing is used in an off-line circumstance, a storage of a large capacity is needed to store a considerable amount of 3D animation data. In addition, when used in an on-line circumstance, key framing also requires not only such a large capacity storage but also high-speed data transmission lines, which can transmit a considerable amount of data at a time at high speeds, so as to transmit 3D animation information from a server to a terminal. In this case, as the possibility of errors to occur during transmission of data increases, the reliability of the data decreases. Therefore, an effective method for compressing and decoding data so as to reduce the amount of interpolator node data is required.

MPEG-4 BIFS provides two different methods for encoding animation data. One is BIFS-Q for encoding animation data, and the other is differential pulse code modulation (DPCM) for encoding differences among data. DPCM is also called predictive MF coding (PMFC). BIFS-Q only uses quantization and thus is not considered effective. PMFC is considered more effective than BIFS-Q because in PMFC, entropy encoding is performed to remove redundant data after DPCM is performed. A PMFC encoder and a PMFC decoder for key data is shown in FIG. 1. As described above, PMFC is not sufficiently effective in encoding animation data because it only performs DPCM before entropy encoding without taking into consideration the characteristics of keys and a correlation between the keys.

Referring to FIG. 1, input key data 105 is input into an encoder 100. A quantizer 110 receives the input key data 105 and quantizes them into integers. A DPCM processor 115 receives the quantized key data and generates differential data. An entropy encoder 120 receives the differential data, removes redundancy existing among bits in terms of the probability of symbols occurring, and generates a compressed bitstream 125. The bitstream 125 generated by the encoder 100 shown in FIG. 1 is input into an entropy decoder 155 of a decoder 150 and is entropy-decoded. The entropy-decoded differential data are input into an inverse DPCM processor 160 as quantized differential data, and an inverse quantizer 165 performs inverse quantization on the quantized key data input from the inverse DPCM processor 160 and outputs decoded key data.

However, the encoder 100 only performs DPCM before entropy encoding without considering the characteristics of a key, and thus it is very difficult to achieve effective encoding showing a high compression rate.

SUMMARY OF THE INVENTION

To solve the above and other problems, it is a first aspect of the present invention to provide an apparatus and a method for encoding data which are capable of compressing animation key data with a high efficiency taking the characteristics of key data into consideration when removing redundancy among bits of key data.

It is a second aspect of the present invention to provide an apparatus and a method for decoding bitstream encoded by the apparatus and the method for encoding data described above.

To achieve the above and other aspects of the present invention, there is provided an apparatus for encoding DPCMed differential data of key data. The apparatus for encoding DPCMed differential data of key data includes a DND operator which performs on input differential data a predetermined number of times a DND operation, in which a divide operation is performed on the input differential data so as to divide differential data belonging to a positive number region into halves and so as to convert one half of the differential data belonging to an upper range than the other half into negative values, and either a divide-up operation or a divide-down operation is selectively performed on the results of the divide operation depending on the range of the results of the divide operation so as to reduce the range of differential data belonging to a negative number region or the positive number region, respectively, a shift-up operator which performs a shift-up operation on the results of the DND operation so as to transfer the differential data having been through the DND operation to either the positive or negative number region, a differential data selector which selectively outputs either the differential data having been through the DND operation or the differential data having been through the shift-up operation, and an entropy encoder which entropy-encodes the differential data selected by the differential data selector.

To achieve the above and other aspects of the present invention, there is provided an apparatus for encoding DPCMed differential data of key data. The apparatus for encoding DPCMed differential data of key data includes a shifter which obtains a differential datum (mode) having the highest frequency among the differential data and subtracts the mode from each of the differential data, a folding processor which converts the differential data into either a positive number region or a negative number region, a DND processor which in consideration of the relationship between the converted differential data and maximum and minimum values among them, performs a DND operation on the converted differential data so as to reduce their range, selects one out of the differential data input from the shifter, the differential data input from the folding processor, the differential data having been through the DND operation, and the differential data having been through the shift-up operation as well as the DND operation, and outputs the selected differential data, and an entropy encoder which entropy-encodes the differential data input from the DND processor.

To achieve the above and other aspects of the present invention, there is provided an apparatus for encoding key data, which are information on the locations of key frames on a time axis. The apparatus for encoding key data includes a quantizer which quantizes input differential data with quantization bits, a DPCM processor which generates differential data of the quantized key data, a shifter which obtains a differentia datum (mode) having the highest frequency among the differential data and subtracts the mode from each of the differential data, a folding processor which converts the differential data into a positive number region or a negative number region, a DND processor which in consideration of the relationship between the converted differential data and maximum and minimum values among them, performs a DND operation on the converted differential data so as to reduce their range, selects one out of the differential data input from the shifter, the differential data input from the folding processor, and the differential data having been through the DND operation, and outputs the selected differential data, and an entropy encoder which entropy-encodes the differential data input from the DND processor.

To achieve the above and other aspects of the present invention, there is provided an apparatus for encoding key data, which are information on the locations of key frames on a time axis. The apparatus for encoding key data includes a quantizer which quantizes input differential data into quantization bits, a DPCM processor which generates differential data of the quantized key data, a shifter which obtains a differential datum (mode) having the highest frequency among the differential data and subtracts the mode from each of the differential data, a DND processor which in consideration of the relationship between the converted differential data and maximum and minimum values among them, performs a DND operation on the converted differential data so as to reduce their range, selects one out of the differential data input from the shifter, the differential data having been through the DND operation, and the differential data having been through the shift-up operation as well as the DND operation, and outputs the selected differential data, and an entropy encoder which entropy-encodes the differential data input from the DND processor.

To achieve the above and other aspects of the present invention, there is provided an apparatus for encoding key data, which are information on the locations of key frames on a time axis. The apparatus for encoding key data includes a linear key encoder which identifies in input key data a region where key data linearly increase and encodes the linear key data region, a quantization error minimizer which adjusts maximum and minimum values among the input key data so that a quantization error can be minimized and outputs the adjusted maximum and minimum values, a quantizer which quantizes the input key data with predetermined quantization bits using the maximum and minimum values input from the quantization error minimizer, a floating-point number converter which converts binary numbers representing the beginning and ending key data of the linear key data region input from the linear key encoder and binary numbers representing the maximum and minimum values input from the quantization error minimizer into decimal numbers, a DPCM processor which generates differential data of the quantized key data, a shifter which obtains a differential datum (mode) having the highest frequency among the differential data and subtracts the mode from each of the differential data, a folding processor which converts the differential data into a positive number region or a negative number region, a DND processor which performs a DND operation on the converted differential data so as to reduce their range, selects one out of the differential data input from the shifter, the differential data input from the folding processor, the differential data having been through the DND operation and the differential data having been through the shift-up operation as well as the DND operation, and outputs the selected differential data, an entropy encoder which entropy-encodes the differential data input from the DND processor, and a key header encoder which generates key header data using data required for encoding which are input from at least one of the linear key encoder, the quantizer, the floating-point number converter, the DPCM processor, the shifter, the folding processor, the DND processor, and the entropy encoder.

To achieve the above and other aspects of the present invention, there is provided an apparatus for encoding key data, which are information on the locations of key frames on a time axis. The apparatus for encoding key data includes a linear key encoder which identifies in input key data a region where key data linearly increase and encodes the linear key data region, a floating-point number converter which converts binary numbers representing the beginning and ending key data of the linear key data region input from the linear key encoder and binary numbers representing the maximum and minimum values input from the quantization error minimizer into decimal numbers, a quantizer which receives the input key data except for the linear key region and quantizes them with predetermined quantization bits, an entropy encoder which entropy-encodes the quantized key data performing a predetermined operation on them, and a key header encoder which receives the number of key data in the linear key data region from the linear key encoder, receives the beginning and ending key data of the linear key region from the floating-point number converter, and encodes all the inputs as a key header.

To achieve the above and other aspects of the present invention, there is provided an apparatus for decoding an encoded bitstream by performing a quantization operation and a predetermined number of cycles of DPCM operation on key data, which is information on the location of a keyframe on a temporal axis, and then performing at least one of a shifting operation, which can reduce the range of differential data, a folding operation, and a predetermined number of cycles of DND operation. The apparatus for decoding an encoded bitstream includes an entropy decoder which entropy-decodes an input bitstream and outputs decoded differential data, an inverse DND operator which depending on the order of DND read from the bitstream, either performs an inverse DND operation on the entropy-decoded differential data or bypasses them, an inverse folding processor which depending on the order of DND, either performs an inverse folding operation on the differential data input from the inverse DND operator so that the differential data can be divided into positive numbers and negative numbers or bypasses the differential data, an inverse shifter which changes the range of the differential data input from the inverse DND operator or the inverse folding processor by adding a predetermined mode to the differential data, an inverse DPCM processor which restores the differential data having been through the inverse shifting operation and outputs quantized key data, and an inverse quantizer which inversely quantizes the restored quantized key data and outputs decoded key data.

To achieve the above and other aspects of the present invention, there is provided an apparatus for decoding a bitstream, which is encoded by performing quantization and a predetermined number of cycles of DPCM on key data, which are information on the locations of key frames on a time axis, and then performing at least one out of a shifting operation, a predetermined number of cycles of DND operation, and a shift-up operation on the results of the quantization and the predetermined number of cycles of DPCM. The apparatus for decoding a bitstream includes an entropy decoder which entropy-decodes an input bitstream and outputs decoded differential data, an inverse DND processor which depending on the order of DND read from the bitstream, either performs an inverse DND operation on the entropy-decoded differential data or bypasses them, an inverse shifter which changes the range of the differential data input from the inverse DND processor by adding a predetermined mode to the input differential data, an inverse DPCM processor which restores the differential data having been through the inverse shifting operation and outputs quantized key data, and an inverse quantizer which inversely quantizes the restored quantized key data and outputs decoded key data.

To achieve the above and other aspects of the present invention, there is provided an apparatus for decoding a bitstream, which is encoded by performing quantization and a predetermined number of cycles of DPCM on key data, which are information on the locations of key frames on a time axis, and then performing at least one out of a shifting operation, a folding operation, and a predetermined number of cycles of DND operation on the results of the quantization and the predetermined number of cycles of DPCM. The apparatus for decoding a bitstream includes an entropy decoder which entropy-decodes an input bitstream and outputs decoded differential data, an inverse DND processor which depending on the order of DND read from the bitstream, either performs an inverse DND operation on the entropy-decoded differential data or bypasses them, an inverse folding processor which depending on the order of DND, either performs an inverse folding operation on the differential data input from the inverse DND processor so that the differential data can be divided into positive values and negative values or bypasses the differential data, an inverse shifter which changes the range of the differential data input from the inverse folding processor by adding a predetermined mode to the differential data, an inverse DPCM processor which restores the differential data having been through the inverse shifting operation and outputs quantized key data, an inverse quantizer which inversely quantizes the restored quantized key data and outputs decoded key data, a floating-point number inverse converter which extracts from the bitstream decimal numbers representing the beginning and ending key data of a linear key data region and decimal numbers representing maximum and minimum values used in the inverse quantizer, converts the decimal numbers into binary numbers, and outputs the binary numbers, and a linear key decoder which decodes linear key data using the beginning and ending key data of the linear key data region, which are input from the floating-point number inverse converter, and adds the results of the decoding to the key data output from the inverse quantizer.

To achieve the above and other aspects of the present invention, there is provided an apparatus for decoding a bitstream, into which key data which are information on the locations of key frames on a time axis are encoded. The apparatus for decoding a bitstream includes a key header decoder which decodes key header information required for decoding encoded key data from an input bitstream, an entropy decoder which entropy-decodes the bitstream and outputs quantized key data, a floating-point number inverse converter which receives from the key header decoder decimal numbers representing the beginning and ending key data of a linear key data region and decimal numbers representing maximum and minimum values used for inversely quantizing the quantized key data, converts the decimal numbers into binary numbers, and outputs the binary numbers, an inverse quantizer which inversely quantizes the quantized key data using the maximum and minimum values and outputs decoded key data, and a linear key decoder which decodes linear key data using the beginning and ending key data of the linear key region, which are input from the floating-point number inverse converter, and adds the decoded linear key data to the key data output from the inverse quantizer.

To achieve the above and other aspects of the present invention, there is provided a method for encoding DPCMed differential data of key data, which are information on the locations of key frames on a time axis. The method includes performing on input differential data a predetermined number of times a DND process, in which a divide operation is performed on the input differential data so as to divide differential data belonging to a positive number region into halves and so as to convert one half of the differential data belonging to an upper range than the other half into negative values and either a divide-up operation or a divide-down operation is selectively performed on the results of the divide operation so as to reduce the range of differential data belonging to a negative number region or the positive number region, respectively, performing a shift-up operation on the results of the DND operation so as to transfer the differential data having been through the DND operation to either the positive or negative number region, selecting either the differential data having been through the DND operation or the differential data having been through the shift-up operation, and entropy-encoding the selected differential data selected.

To achieve the above and other aspects of the present invention, there is provided a method for encoding DPCMed differential data of key data, which are information on the locations of key frames on a time axis. The method includes performing a shifting operation in which a differential datum (mode) having the highest frequency is obtained from among the differential data and is subtracted from each of the differential data, performing a folding operation on the differential data having been through the shifting operation so that the differential data are transferred to either a positive number region or a negative number region, performing a DND process in which in consideration of the relationship between the differential data having been through the folding operation and maximum and minimum values among them a DND operation is performed on the differential data having been through the folding operation so as to reduce their range, and one out of the differential data having been through the shifting operation, the differential data having been through the folding operation, the differential data having been through the DND operation, and the differential data having been through the shift-up operation as well as the DND operation is selected, and entropy-encoding the selected differential data.

To achieve the above and other aspects of the present invention, there is provided a method for encoding key data, which are information on the locations of key frames on a time axis. The method includes quantizing key data to be encoded with quantization bits, performing a DPCM process so that differential data of the quantized key data are generated, performing a shifting operation in which a differentia datum (mode) having the highest frequency is obtained from among the differential data and is subtracted from each of the differential data, converting the differential data into a positive number region or a negative number region, performing a DND process in which in consideration of the relationship between the differential data having been through the folding operation and maximum and minimum values among them, a DND operation is performed on the differential data having been through the folding operation so as to reduce their range, and one out of the differential data having been through the shifting operation, the differential data having been through the folding operation, and the differential data having been through the DND operation is selected, and entropy-encoding the selected differential data.

To achieve the above and other aspects of the present invention, there is provided a method for encoding key data, which are information on the locations of key frames on a time axis, in key-frame based graphic animation. The method includes performing linear key encoding in which a region where key data linearly increase is identified and encoded, performing floating-point number conversion so that binary numbers representing the beginning and ending key data of the linear key data region are converted into decimal numbers, performing quantization error minimization in which maximum and minimum values among the key data to be encoded are adjusted so that a quantization error can be minimized and binary numbers representing the adjusted maximum and minimum values are converted into decimal numbers, performing quantization in which the key data to be encoded are quantized with predetermined quantization bits using the adjusted maximum and minimum values, performing a DPCM process so that differential data of the quantized key data are generated, performing a shifting operation in which a differential datum (mode) having the highest frequency is obtained from the differential data and is subtracted from each of the differential data, performing a folding operation so that the differential data having been through the shifting operation are transferred to either a positive number region or a negative number region, performing a DND process in which a DND operation is performed on the differential data having been through the folding operation so as to reduce their range and one out of the differential data having been through the shifting operation, the differential data having been through the folding processor, the differential data having been through the DND operation, and the differential data having been through a shift-up operation as well as the DND operation is selected, entropy-encoding the selected differential data, and performing key header encoding, in which data which have been generated in at least one of the linear key encoding, the quantization, the floating-point number conversion, the DPCM process, the shifting operation, the folding operation, the DND process, and the entropy encoding and are required for decoding are generated as a key header.

To achieve the above and other aspects of the present invention, there is provided a method for encoding key data, which are information on the locations of key frames on a time axis. The method includes performing linear key encoding in which a region where key data linearly increase is identified in key data to be encoded and then is encoded, performing floating-point number conversion so that binary numbers representing the beginning and ending key data of the linear key data region are converted into decimal numbers, quantizing all the key data to be encoded except for the linear key region with predetermined quantization bits, entropy-encoding the quantized key data performing a predetermined operation on them, and performing key header encoding in which the number of key data in the linear key data region and the converted beginning and ending key data of the linear key region are encoded as a key header.

To achieve the above and other aspects of the present invention, there is provided a method for decoding an encoded bitstream of DPCMed differential data of key data, which are information on the locations of key frames on a time axis, performing a DND operation. The method includes entropy-decoding a bitstream to be decoded, performing an inverse shift-up operation on the entropy-decoded differential data in which if the entropy-decoded differential data have been encoded through a shift-up operation, a shift-down operation is performed on them so that they are restored into differential data having been through a DND operation, and performing an inverse DND operation on the differential data having been through the shift-down operation if the entropy-decoded differential data have been through a shift-up operation as many times as the order of DND read from the bitstream and performing the inverse DND operation on the entropy-decoded differential data if they have not been through a shift-up operation as many times as the order of DND.

To achieve the above and other aspects of the present invention, there is provided a method for decoding a bitstream, which is encoded by performing quantization and a predetermined number of cycles of DPCM operation on key data, which are information on the locations of key frames on a time axis, and then performing at least one out of a shifting operation, a folding operation, and a predetermined number of cycles of DND operation on the results of the quantization and the predetermined number of cycles of DPCM, in key-frame based graphic animation. The method includes (a) entropy-decoding a bitstream and thus generating decoded differential data, (b) performing an inverse DND operation on the decoded differential data, (c) performing an inverse folding operation on the differential data having been through the inverse DND operation so that they are divided into negative numbers and positive numbers, (d) performing an inverse shifting operation in which the range of the differential data having been through the inverse folding operation is transferred by adding a predetermined mode to them, (e) performing an inverse DPCM process so that the differential data having been through the inverse shifting operation are restored and thus quantized key data are generated, and (f) generating decoded key data by inversely quantizing the quantized key data. Here, if the order of DND read from the bitstream shows that the entropy-decoded differential data have not been through a DND operation, step (C) is performed right after step (a), and if the order of DND shows that the entropy-decoded differential data have not been through a DND operation nor a folding operation, step (d) is performed right after step (a).

To achieve the above and other aspects of the present invention, there is provided a method for decoding a bitstream, which is encoded by performing quantization and a predetermined number of cycles of DPCM on key data, which are information on the locations of key frames on a time axis, and then performing at least one out of a shifting operation, a predetermined number of cycles of DND operation, and a shift-up operation on the results of the quantization and the predetermined number of cycles of DPCM. The method includes (a) entropy-decoding the bitstream and thus generating decoded differential data, (b) performing an inverse DND process on the decoded differential data, (c) performing an inverse shifting operation on the differential data having been through the inverse DND operation by adding a predetermined mode to the differential data so that their range is changed, (d) performing an inverse DPCM process so that the differential data having been through the inverse shifting operation are restored and thus quantized key data are generated, and (e) inversely quantizing the quantized key data so that decoded key data are generated. Here, if the order of DND read from the bitstream shows that the entropy-decoded differential data have not been through a DND operation, step (C) is performed right after step (a).

To achieve the above and other aspects of the present invention, there is provided a method for decoding a bitstream, which is encoded by performing quantization and a predetermined number of cycles of DPCM on key data, which are information on the locations of key frames on a time axis, and then performing at least one out of a shifting operation, a folding operation, and a predetermined number of cycles of DND operation on the results of the quantization and the predetermined number of cycles of DPCM. The method includes (a) entropy-decoding a bitstream and thus generating decoded differential data, (b) performing an inverse DND process on the decoded differential data, (c) performing an inverse folding operation on the differential data having been through the inverse DND operation so that they are divided into negative numbers and positive numbers, (d) performing an inverse shifting operation in which the range of the differential data having been through the inverse folding operation is transferred by adding a predetermined mode to them, (e) performing an inverse DPCM process so that the differential data having been through the inverse shifting operation are restored and thus quantized key data are generated, (f) performing floating-point number inverse conversion in which decimal numbers representing maximum and minimum values used for inversely quantizing the quantized key data are obtained from the bitstream and decimal numbers representing the beginning and ending key data of a linear key data region are converted into binary numbers, (g) inversely quantizing the quantized key data using the maximum and minimum values and thus generating decoded key data, and (h) performing linear key decoding in which linear key data are decoded using the beginning and ending key data of the linear key region and the decoded linear key data are added to the inversely quantized key data. Here, if the order of DND read from the bitstream shows that the entropy-decoded differential data have not been through a DND operation, step (C) is performed right after step (a), and if the order of DND shows that the entropy-decoded differential data have not been through a DND operation nor a folding operation, step (d) is performed right after step (a).

To achieve the above and other aspects of the present invention, there is provided a method for decoding a bitstream, wherein key data which are information on the locations of key frames on a time axis are encoded. The method includes performing key header decoding so that key header information required for decoding encoded key data is decoded from the bitstream, entropy-decoding the bitstream and generates quantized key data, performing floating-point number inverse conversion so that decimal numbers representing the beginning and ending key data of a linear key data region and decimal numbers representing maximum and minimum values used for inversely quantizing the quantized key data are converted into binary numbers, inversely quantizing the quantized key data using the maximum and minimum values and thus generating decoded key data, and performing linear key decoding so that linear key data are decoded using the beginning and ending key data of the linear key region and the decoded linear key data are added to the inversely quantized key data.

In the present invention, the degree of dispersion of key data is calculated first during encoding the key data, in order to take advantage of the characteristics of the key data well. As described above, the key data represent the location of a keyframe on a temporal axis, and thus key data values monotonously increase in the order from key data representing the first key frame to key data representing the last keyframe. Accordingly, differential data obtained by a first DPCM operation are supposed to have positive values, and if a second DPCM operation is performed on the differential data, the results of the second DPCM operation are supposed to have either positive or negative values.

In general, the smaller a difference between maximum and minimum values among key data is, the more redundant values exist, and the more redundant values exist, the higher compression rate an entropy encoder has. Accordingly, in the present invention, entropy encoding is performed after reducing the range of key data. The order of DPCM and the order of DND, by which a minimum dispersion degree can be obtained, and the results of each cycle of both DPCM and DND are used to reduce the range of key data. As the dispersion of key data decreases, the redundancy of the key data increases.

BRIEF DESCRIPTION OF THE DRAWINGS

The above and other aspects and advantages of the present invention will become more apparent by describing in detail preferred embodiments thereof with reference to the attached drawings in which:

FIG. 2A is a block diagram of an encoder according to a preferred embodiment of the present invention;

FIGS. 2C through 2G are block diagrams of examples of an encoder according to the present invention;

FIG. 8 is a diagram illustrating entropy encoding according to a preferred embodiment of the present invention;

FIGS. 14A through 14E are diagrams showing examples of bitstream syntax and variables required for decoding; and FIGS. 15A through 15C are diagrams showing examples of program codes into which operations required for decoding key data are realized.

DETAILED DESCRIPTION OF THE INVENTION

FIG. 2A is a block diagram of an encoder according to a preferred embodiment of the present invention.

Figure 3A:
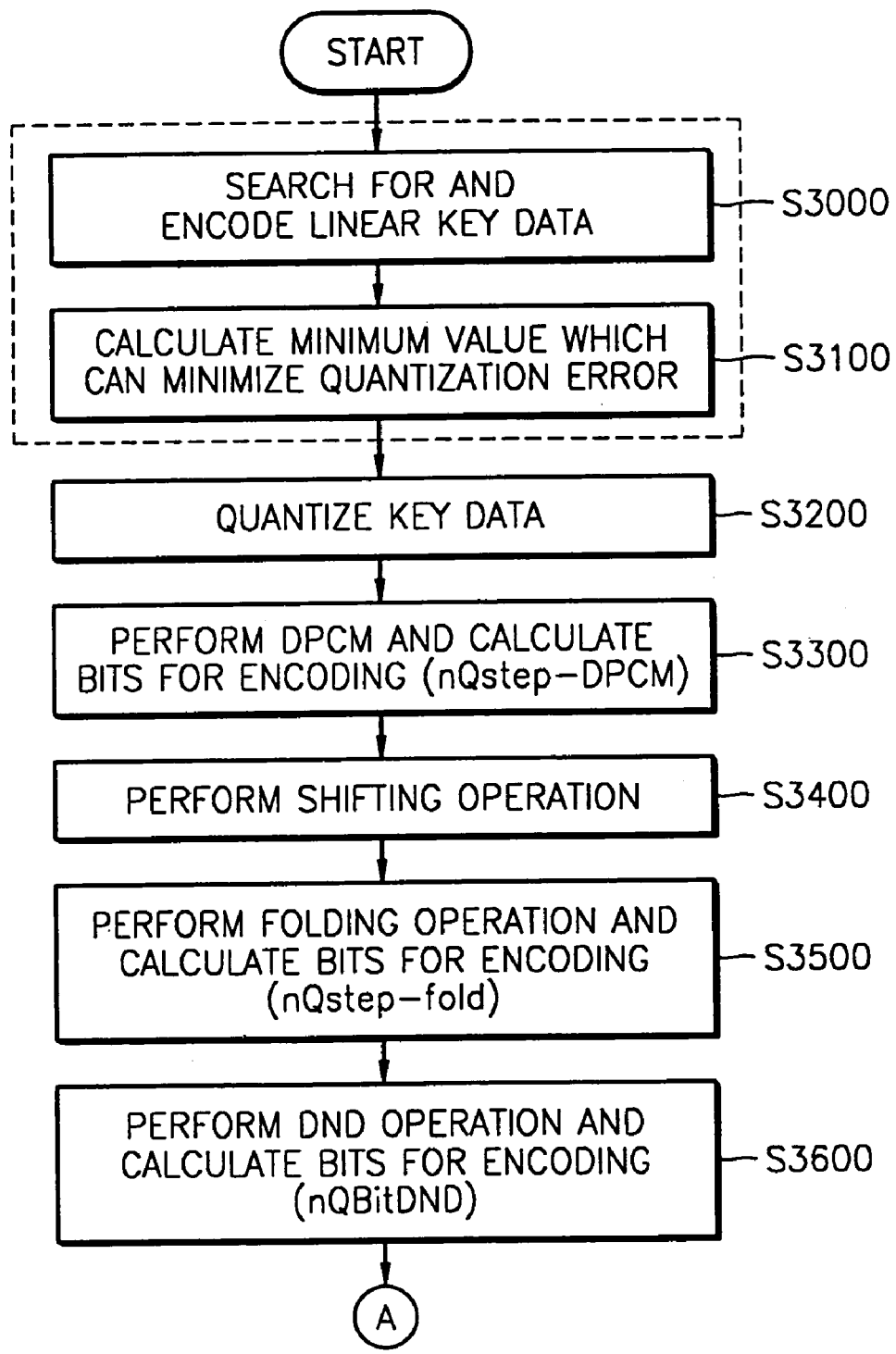
FIGS. 3A and 3B are flowcharts of a method for encoding key data according to a preferred embodiment of the present invention.
Figure 3B:
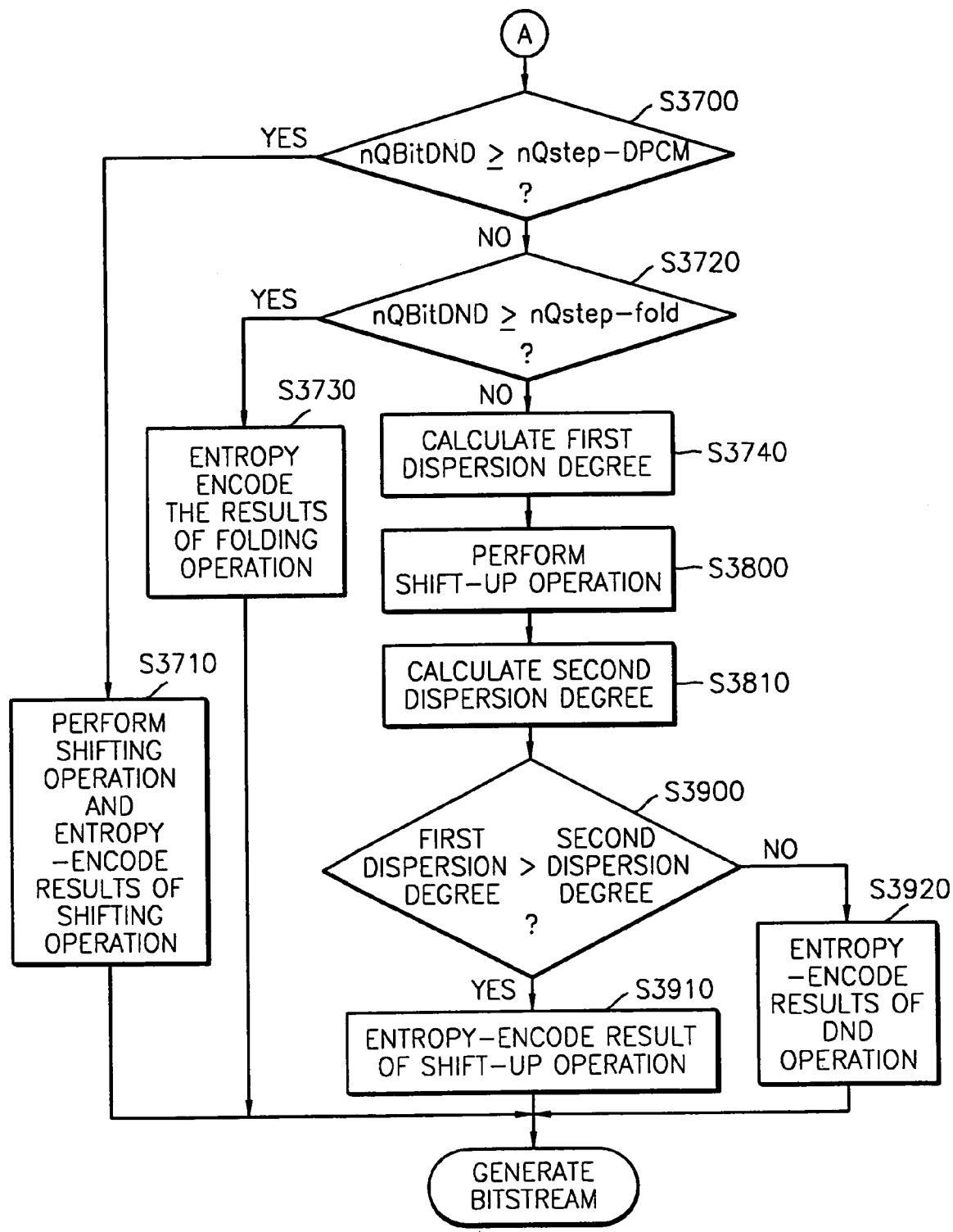

A method for encoding key data according to a preferred embodiment of the present invention will now be described with reference to FIGS. 3A and 3B. FIGS. 3A and 3B are flowcharts of the method for encoding key data. Referring to FIGS. 3A and 3B, if key data are input into an encoder, information on, for example, the number of key data and the number of digits of each of the key data, is input into a key header encoder 270 and is encoded. A linear key encoder 200 searches for a region in the input key data where key frames exist at certain temporal intervals, key data have the same difference, and the key data changes linearly, and the searched linear region is encoded first in step S3000.

Famous 3D application software, such as 3Dmax Maya, generates key-frame based animation using keys having a predetermined time gap therebetween in specific regions. In this case, it is possible to easily encode key data using the beginning and ending key data of a linear key data region and the number of key frames existing between them. Accordingly, linear prediction is very useful for encoding keys in a certain region using an interpolator.

The following equation is used for linear prediction.

$$t(i) = \frac{t_E - t_S}{E - S} + t_S (0 \leq i \leq E - S, S < E) \quad (1)$$

Here, $t_S$ represents the data of a key where a partially linear region begins, $t_E$ represents the data of a key where the partially linear region ends, S represents an index of $t_S$, and E represents an index of $t_E$. The error between real key data in a specific region ranging from S-th key data to E-th key data and key data linearly predicted following Equation (1) can be calculated using the following equation.

$$e_i = t(i) - t_{i+S} = \frac{t_E - t_S}{E - S} i + t_S - t_{i+S} \quad (2)$$

If a maximum value among errors calculated using Equation (2) is not greater than a predetermined critical value, $t_i$ can be considered co-linear in region $[t_S, t_E]$ or within a certain range of errors. Whether or not the maximum error value $t_i$ is co-linear with the specific region is determined using the following Equation (3).

$$E_p = \MAX_{i=0,\ldots(E-S)} |e_i| = \MAX_{i=0,\ldots(E-S)} \left| \frac{t_E - t_S}{E - S} i + t_S - t_{i+S} \right| \quad (3)$$

If $$E_p \leq \frac{1}{2^{nBits+1}},$$

$t_i$ co-linear with region $[t_S, t_E]$. Here, nBits represents the number of bits used for encoding.

If the linear key encoder 200 searches for the partially linear region the beginning and ending key data of the partially linear key data region are output to the floating-point number converter 205. The number of keys included in the linear key data region is output to the key header encoder 270 and is encoded. It is possible to considerably reduce the amount of data to be encoded using linear encoding.

The beginning key data and the ending key data are encoded using floating-point number conversion, which will be described later.

The floating-point number converter 205 converts key data represented in the binary system into the decimal system in order to encode the beginning key data and the ending key data.

A computer stores floating-point numbers as 32-bit binary numbers. If a floating-point number represented in the binary system is given, the floating-point number converter 205 converts the floating-point number into a mantissa and an exponent in the decimal system, and this process is expressed by the following equation.

$$\underbrace{mantissa\_binary * 2^{exponent\_binary}}_{\text{the floating-point number in binary system}} = \underbrace{mantissa * 10^{exponent}}_{\text{the floating-point number in decimal system}} \quad (4)$$

For example, a floating-point number 12.34 can be converted into a binary number by a computer, which is shown in the following.

$$\underset{1}{0} \; \underset{2}{10001010111000010100011} \; \underset{3}{10000010}$$

1: the sign
2: the mantissa in the binary system
3: the exponent in the binary system The binary number can be converted into a decimal number following Equation (4), which is shown in the following.

$$\underset{1}{0} \; \underset{2}{1234} \; \underset{3}{2}$$

1: the sign
2: the mantissa in the decimal system
3: the exponent in the decimal system In order to include a mantissa and an exponent in the decimal system in a bitstream, the numbers of bits required to represent the mantissa and the exponent must be calculated. The exponent has a value between −38 and 38 and thus can be expressed together with its sign using 7 bits. The number of bits required to represent the mantissa is dependent on the number of digits. The values of the mantissa and the number of bits required to represent the mantissa are shown in the following table.

TABLE 1

| Values of mantissa | Digits of mantissa | Number of bits required |
|---|---|---|
| 0 | 0 | 0 |
| 1-9 | 1 | 4 |
| 10-99 | 2 | 7 |
| 100-999 | 3 | 10 |
| 1000-9999 | 4 | 14 |
| 10000-99999 | 5 | 17 |
| 100000-999999 | 6 | 20 |
| 1000000-9999999 | 7 | 24 |

Figure 4A:
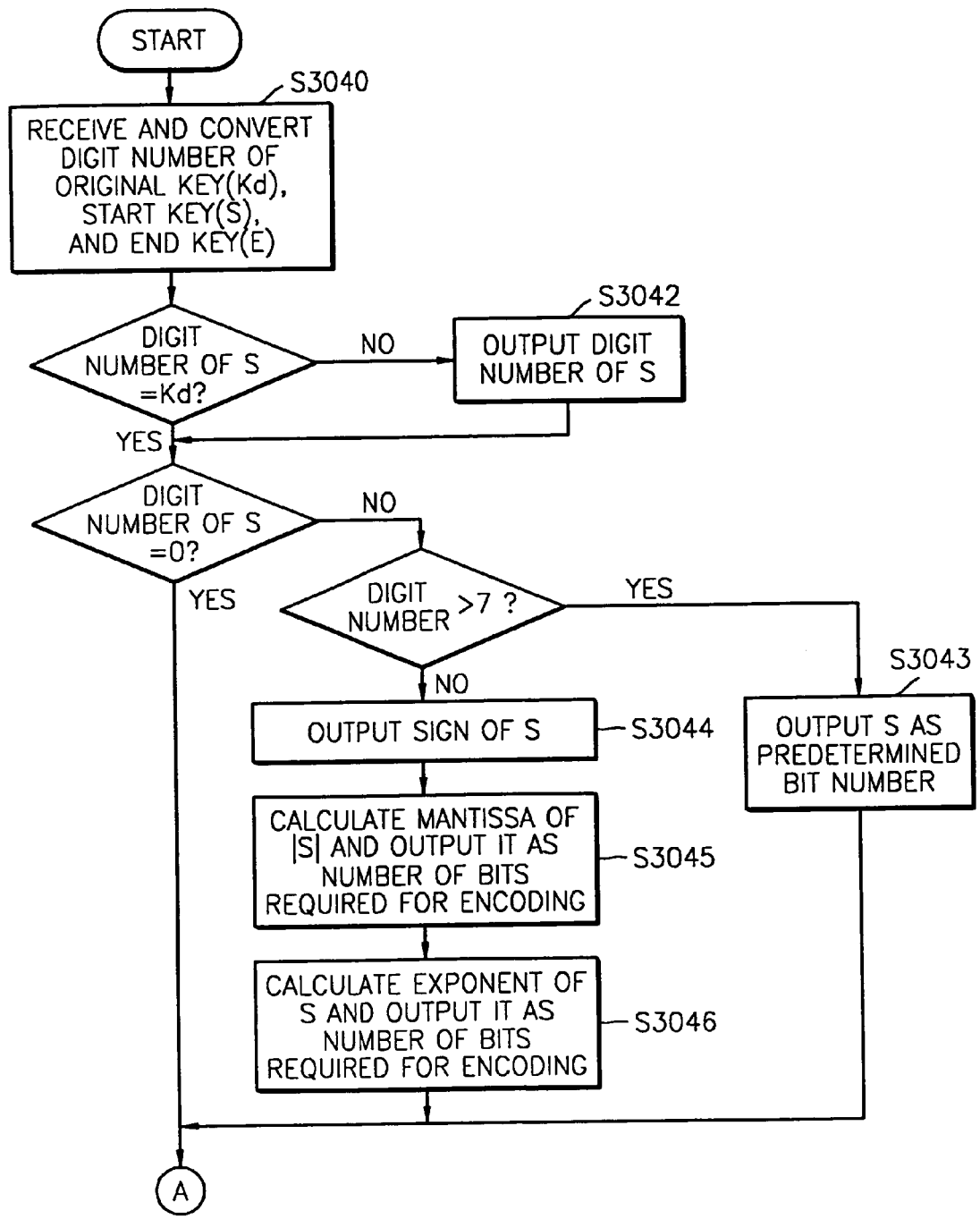
FIGS. 4A and 4B are flowcharts of a floating-point number conversion process according to a preferred embodiment of the present invention.
Figure 4B:
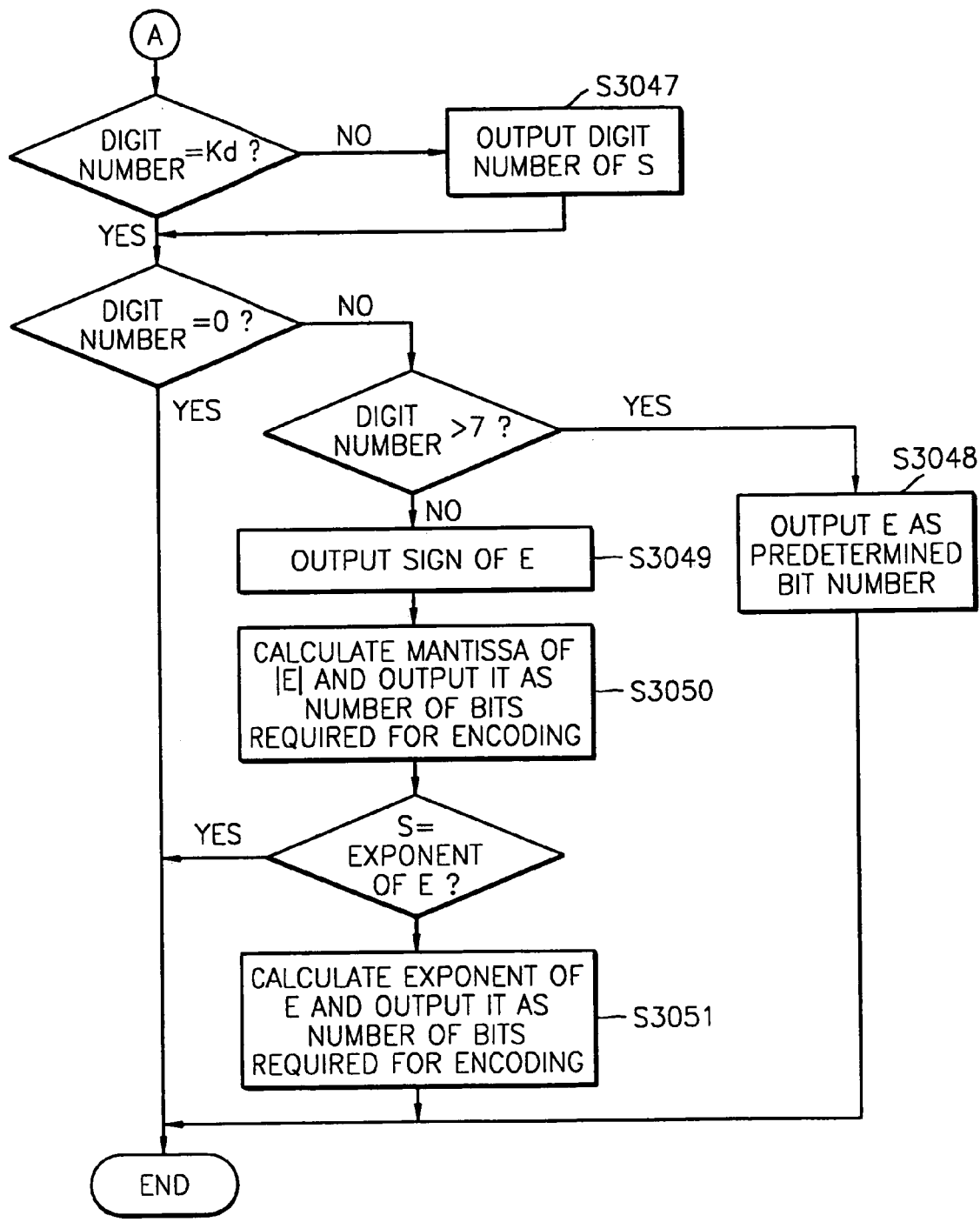

The beginning and ending key data of the linear key data region that has been searched for and converted using the above-mentioned processes are encoded following the encoding process shown in FIGS. 4A and 4B, are output to the key header encoder 270, and are stored in the bitstream.

FIGS. 4A and 4B show that the floating-point number converter 205 encodes two input floating-point numbers. The way the floating-point number converter 205 encodes a floating-point number will be described with reference to FIGS. 4A and 4B.

The floating-point number converter 205 receives the digit number Kd of original key data, beginning key data S, and ending key data E and converts them in step S3040 following Equation (4).

The floating-point number converter 205 encodes S first. In particular, the floating-point number converter 205 checks whether or not the digit number of S is different from Kd. If the digit number of S is different from Kd, the digit number of S is obtained and is output to the key header encoder 270 in step S3042. The floating-point number converter 205 obtains the digit number of S using function Digit ( ).

If the digit number of S is greater than 7, S is output to the key header encoder 270 using a predetermined number of bits (in the present invention, 32 bits are used following a floating-point number manner of IEEE Standard 754) in step 3043 so that the digit number of S can be included in the bitstream.

If the digit number of S is not 0 and is smaller than 7, the floating-point number converter 205 outputs the sign of S to the key header encoder 270 in step 3044. The number of bits required to encode the absolute value of the mantissa of S, is obtained using Table 1. Next, the absolute value of the mantissa of S is output to the key header encoder 270 using the number of bits obtained using Table 1, in step 3045. The floating-point number converter 305 calculates the exponent of S, outputs the sign of S to the key header encoder 270, and outputs the exponent to the key header encoder 270 as a predetermined number of bits, for example, 6 bits, in step S3046. Such key data conversion makes it possible to considerably reduce the number of bits included in the bitstream.

If the digit number of S is 0, the encoding of the beginning key data is ended, and the method goes to a step of converting the ending key data E because when the digit number of S is 0, the corresponding floating-point number is also 0 which does not require encoding.

After converting and encoding the beginning key data S, the floating-point number converter 205 converts the ending key data E. The conversion of E is almost the same as that of S. In particular, it is checked whether or not the exponent of E is the same as that of S in step S3047. If the exponent of E is the same as that of S, only a flag bit representing that the exponent of E is the same as the exponent of S is output to the key header encoder 270. If the exponent of E is not the same as that of S, the exponent of E as well as the flag bit is output to the key header encoder 270 in the same way as the exponent of S has been output to the key header encoder 270, in step S3048.

Key data among the input key data which do not belong to the linear region are input into the quantizer 210 and quantized according to a predetermined quantization bit size, i.e., nKeyQBit.

However, in the case of decoding quantized key data using a decoder, it is impossible to perfectly recover original key data due to the error between the original key data and the quantized key data. Therefore, the quantizer 210 of the present invention obtains a maximum value and a minimum value among the input key data and quantizes the input key data using the maximum and minimum values. In addition, the present invention includes a quantization error minimizer 215 so that the error between original key data and their quantized key data can be minimized using the maximum and minimum values among the input key data.

The quantization error minimizer 215 quantizes or inversely quantizes the input key data in advance using a method for controlling a range of quantization so that the quantization error can be minimized, in step S3100.

In particular, if a mixed maximum value used for quantization is represented by Max, a minimum value to be controlled for quantization is represented by Min, an input value is represented by $X_i$, and the number of bits used for quantization is represented by nQuantBit, then, a quantized input value $\tilde{X}_i$, an inversely quantized value $\hat{X}_i$, and an error $e_i$ are obtained using the following equation.

$$\tilde{X}_i = \text{floor}\left(\frac{X_i - \text{Min}}{\text{Max} - \text{Min}} * (2^{nQuantBit} - 1) + 0.5\right) \quad (5)$$

$$\hat{X}_i = \frac{\tilde{X}_i * (\text{Max} - \text{Min})}{2^{nQuantBit} - 1} + \text{Min}$$

$$e_i = X_i - \hat{X}_i$$

There are two methods for reducing the sum $\Sigma e_i$ of errors. One is a method for reducing the sum of errors by continuously controlling Min until the sum of errors is minimized. The other is as follows.

First, let us assume that $X_i = (i+n)\Delta x + \epsilon_i$ where $X_i$ indicates an input key data sequence, $\Delta x$ indicates a basic step size of input data, n is an arbitrary integer, and $\epsilon_i$ indicates zero-mean random noise.

Next, when $d_i = X_i - X_{i-1} = \Delta x + (\epsilon_i - \epsilon_{i-1})$, $\Delta' x = E[d_i]$ and $\text{Min} = \text{Max} - \Delta' x * (2^{nQuantBit} - 1)$.

Min, which can make it possible to minimize a quantization error, and Max are input into the quantizer 210 and are used for quantization of key data.

The quantizer 210 receives the maximum and minimum values Max and Min which can minimize a quantization error and quantizes key data $fKey_i$ in step S3200, following Equation (6).

$$nQKey_i = \text{floor}\left(\frac{fKey_i - fKeyMin}{fKeyMax - fKeyMin}(2^{nKeyQBit} - 1) + 0.5\right) \quad (6)$$

Here, i indicates an index of quantized key data, $nQKey_i$ indicates an array of integers of the quantized key data, $fKey_i$ indicates an array of floating-point numbers of the quantized key data, fKeyMax indicates a maximum value input from the quantization error minimizer 215, fKeyMin indicates a minimum value input from the quantization error minimizer 215, and nKeyQBit indicates a quantization bit size. In Equation (6), function floor(v) is a function which outputs a maximum integer no greater than a certain floating-point value v.

The quantizer 210 of the present invention may not use such algorithm for reducing a quantization error, in which case quantization is performed simply using the maximum and minimum values fKeyMax and fKeyMin among input key data.

Figure 5:
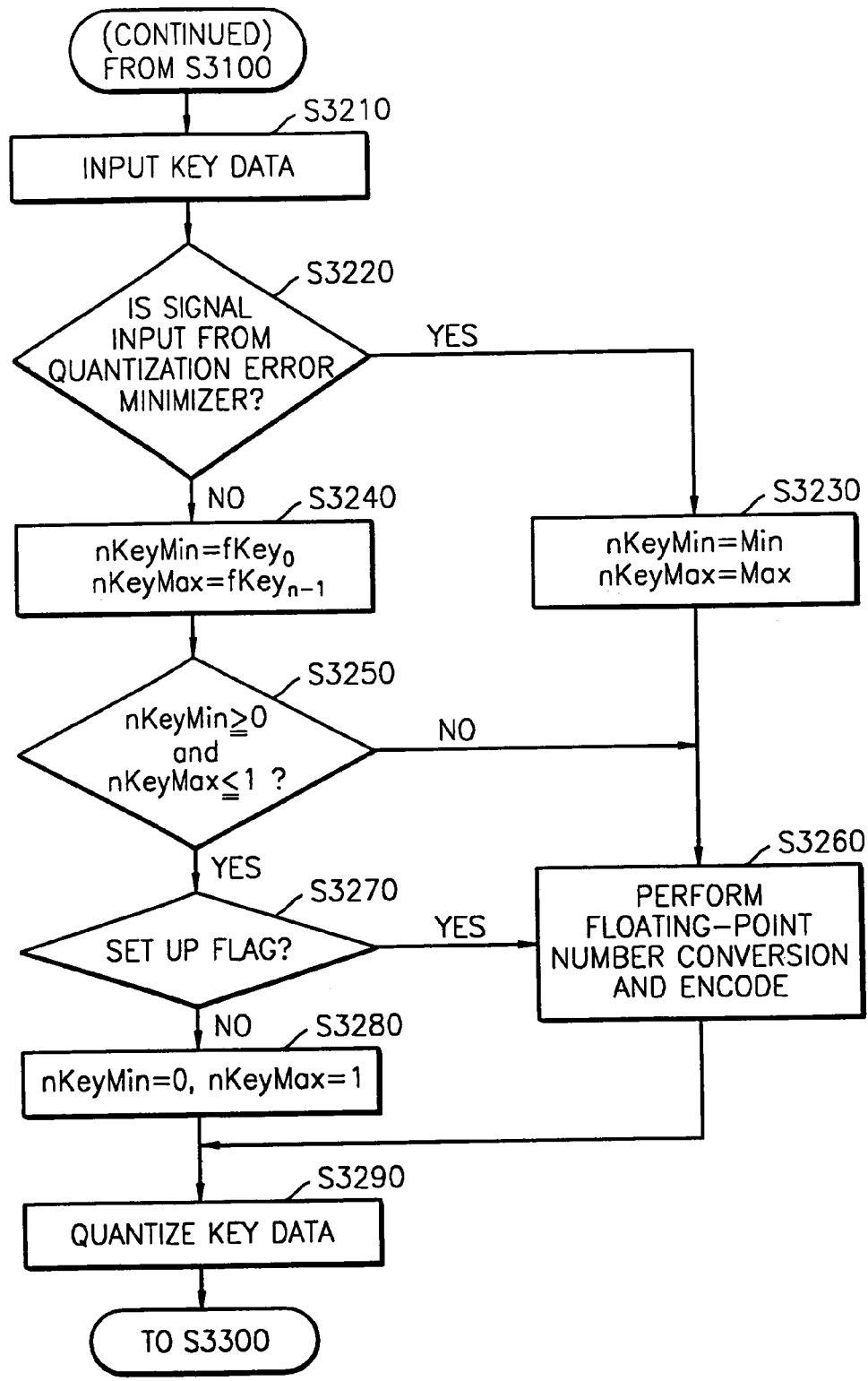
FIG. 5 is a flowchart of a quantization process according to a preferred embodiment of the present invention.

A quantization process of the present invention will be described more fully with reference to FIG. 5.

The quantizer 210 receives key data in step S3210 and checks if the maximum and minimum values MAX and MIN are input from the quantization error minimizer 215 in step S3220.

If MAX and MIN are input, the quantizer 210 sets the maximum and minimum values fKeyMax and fKeyMin for quantization as MAX and MIN, respectively, in step S3230 and outputs the newly set maximum and minimum values fKeyMax and fKeyMin to the floating-point number converter 205. The maximum and minimum values fKeyMax and fKeyMin are converted and encoded through the above-mentioned floating-point number conversion process and are output to the key header encoder 270 so that they can be included in a key header for being used in decoding.

If there is no value input from the quantization error minimizer 215, the quantizer 210 sets first key data $fkey_0$ and final key data $fKey_{N-1}$ as the minimum value fKeyMin and the maximum value fKeyMax, respectively, in step S3240.

Next, the quantizer 210 checks whether or not the maximum value fKeyMax is smaller than 1 but greater than 0 and whether or not the minimum value fKeyMin is greater than 0 in step S3250. If the maximum value fKeyMax is not smaller than 1 or not greater than 0, the maximum and minimum values fKeyMax and fKeyMin are output to the floating-point number converter 105 and are converted and encoded through the above-mentioned floating-point number conversion. Next, the maximum and minimum values fKeyMax and fKeyMin that have been converted and encoded are included in the key header in step S3260 so that they can be used in decoding.

On the other hand, if the maximum value fKeyMax is smaller than 1 and the minimum value fKeyMin is greater than 0, a flag indicating whether the maximum and minimum values fKeyMax and fKeyMin will be included in the key header for being used in decoding is checked in step S3270. If the flag is set up so that the maximum and minimum values fKeyMax and fKeyMin can be included in the key header, step S3260 is performed so that the maximum and minimum values fKeyMax and fKeyMin are output to the key header encoder 270. If the flag is not set up, the quantizer 210 does not allow the maximum and minimum values fKeyMax and fKeyMin to be included in the key header.

In a case where the maximum and minimum values fKeyMax and fKeyMin are not included in the key header, the key data encoder and the key data decoder are supposed to perform encoding and decoding, respectively, setting up the maximum and minimum values fKeyMax and fKeyMin at 1 and 0, respectively. In this case, the quantizer 210 sets up the maximum and minimum values fKeyMax and fKeyMin at 1 and 0, respectively, in step S3280. The maximum and minimum values fKeyMax and fKeyMin are already known to the key data decoder so that they do not need to be included in the key header.

The quantizer 210 quantizes the input key data by substituting the maximum and minimum values fKeyMax and fKeyMin that have been set up through the above-mentioned process into Equation (6) and outputs the quantized key data to a DPCM processor 220 in step S3290.

The DPCM processor 220 receives the quantized key data and performs DPCM on the quantized key data a predetermined number of times. Next, the DPCM processor 220 outputs the order of DPCM, by which a minimum value in the degree of dispersion can be obtained, and intra key data obtained in each cycle of DPCM, to the key header encoder 270. The DPCM processor 220 outputs differential data generated by DPCM to the shifter 230 in step S3300.

Figure 6:
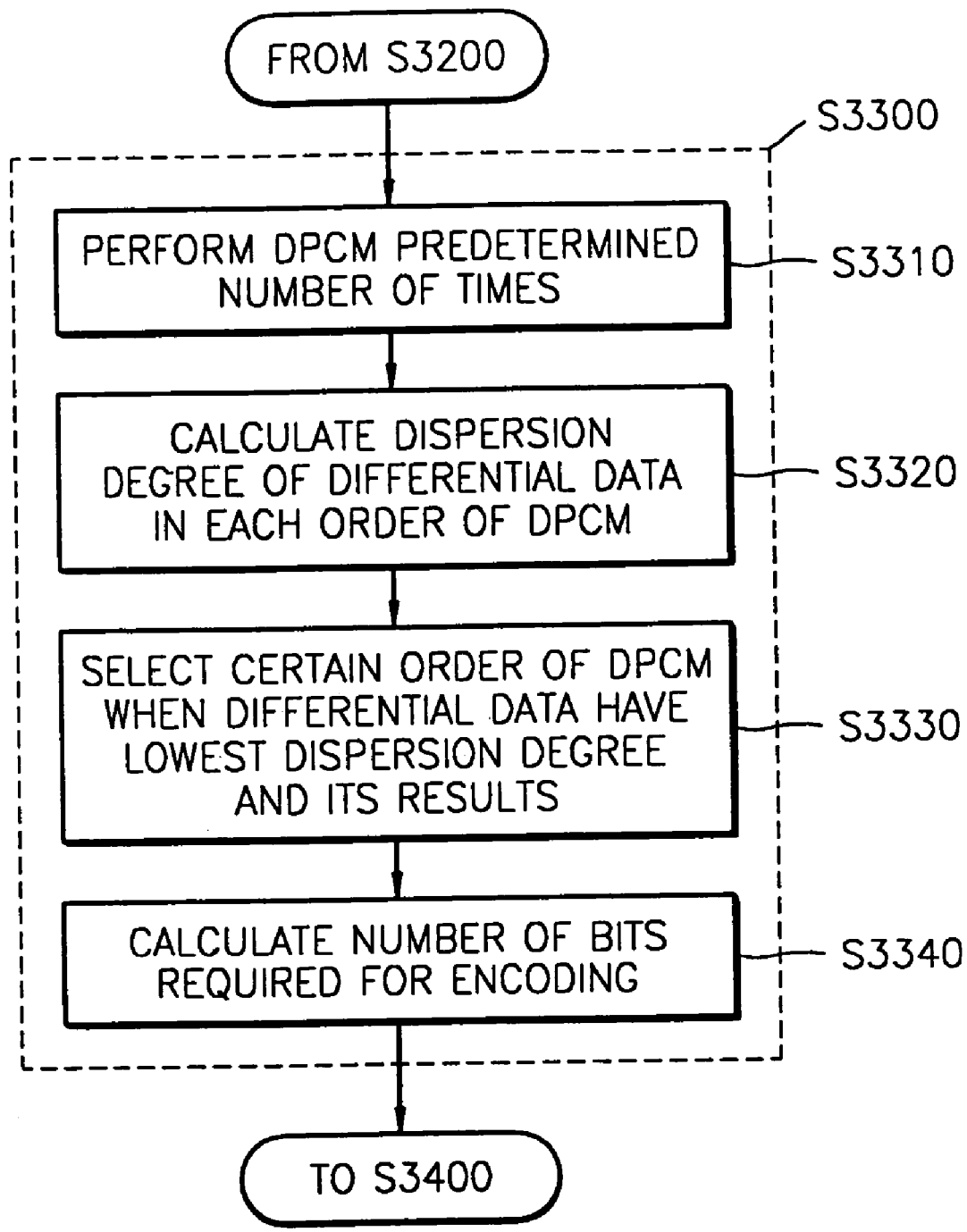
FIG. 6 is a flowchart of a DPCM process according to a preferred embodiment of the present invention.

Referring to FIG. 6, the DPCM processor 220 performs DPCM on the input key data a predetermined number of times and stores the number of cycles of DPCM as the order of DPCM in step S3310. In a preferred embodiment of the present invention, DPCM may be performed three times.

Thereafter, the DPCM processor 220 calculates the degree of dispersion of the results of each cycle of DPCM in step S3320. Here, the degree of dispersion may be represented by dispersion, standard deviation, or quartile deviation, and in a preferred embodiment of the present invention, quartile deviation may be used.

Next, the DPCM processor 220 selects a cycle of DPCM by which a minimum value in the degree of dispersion can be obtained and outputs the results of the selected order of DPCM to the shifter 230. The selected cycle of DPCM, intra key data of each cycle of DPCM and other pieces of information required for DPCM are output to the key header encoder 270 in step S3330. However, in a preferred embodiment of the present invention, DPCM is performed only one time if the number of keys is smaller than 5. For example, a first cycle of DPCM is performed following Equation (7).

$$\Delta_i = nQKey_{i+1} - nQKey_i \quad (7)$$

Here, i indicates an index of quantized key data, $nQKey_i$ indicates an array of integers, and $\Delta_i$ indicates differential data.

The DPCM processor 220 calculates the number of bits required to encode the results of the selected cycle of DPCM and differential data of the key data that have been generated by DPCM in a predetermined memory (nQStep_DPCM) in step S3340. The calculation of the number of bits required for encoding may also be performed later in a subsequent step of selecting key data to be encoded, the fact which is obvious to one skilled in the art.

The shifter 230 selects a differential datum (hereinafter, referred to as a mode) which has the highest frequency from among the differential data input from the DPCM processor 220. Then, the shifter 230 subtracts the mode from all the differential data in step S3400 so that most data to be encoded are arranged a cycle 0 and the number of bits required for encoding can be decreased.

Such shifting operation is performed subtracting mode nKeyShift from all the quantized key data, which is expressed by the following equation.

$$\text{shift}(nQKey_i) = nQKey_i - nKeyShift \quad (8)$$

Here, i indicates an index of quantized key data, $nQKey_i$ indicates an array of integers, and nKeyShift indicates a mode value. As a result of the shifting operation, differential data having the highest frequency become 0 so that the number of bits required for encoding can be considerably reduced.

The key data having been through the shifting operation are output to a folding processor 240 and a DND processor 250, and the mode value nKeyShift is output to the key header encoder 270 so as to be included in the key header.

The folding processor 240 performs a folding operation on the outputs of the shifter 230 and outputs the results of the folding operation to the DND processor 250 in step S3500.

The folding operation is used to reduce the range of differential data that widely disperse over both a positive number region and a negative number region by concentrating them in either the positive or negative number region. In the present embodiment, the folding operation is performed following Equation (9) to concentrate the differential data in the positive number region.

$$\text{fold}(nQKey_i) = 2 \cdot nQKey_i \quad (\text{if } nQKey_i \geq 0) \quad (9)$$
$$= 2|nQKey_i| - 1 \quad (\text{if } nQKey_i < 0)$$

Here, i indicates an index of quantized key data, and $nQKey_i$ indicates an array of integers. As a result of the folding operation, positive differential data are converted into even numbers, and negative different data are converted into odd numbers.

The folding processor 240 calculates the number of bits required for encoding the differential data having been through the folding operation and stores it in a predetermined memory nQStep_fold. In this step, the calculation of the number of bits required for encoding may be performed later in a subsequent step of selecting differential data to be entropy-encoded, the fact which is obvious to one in the art. The data generated by the folding operation in the folding processor 240 are output to the DND processor 250.

In order to enhance the efficiency of entropy encoding, the DND processor 250 performs a DND operation on the input differential data of the key data a predetermined number of times, thus reducing the range of the differential data in S3600.

Figure 1:
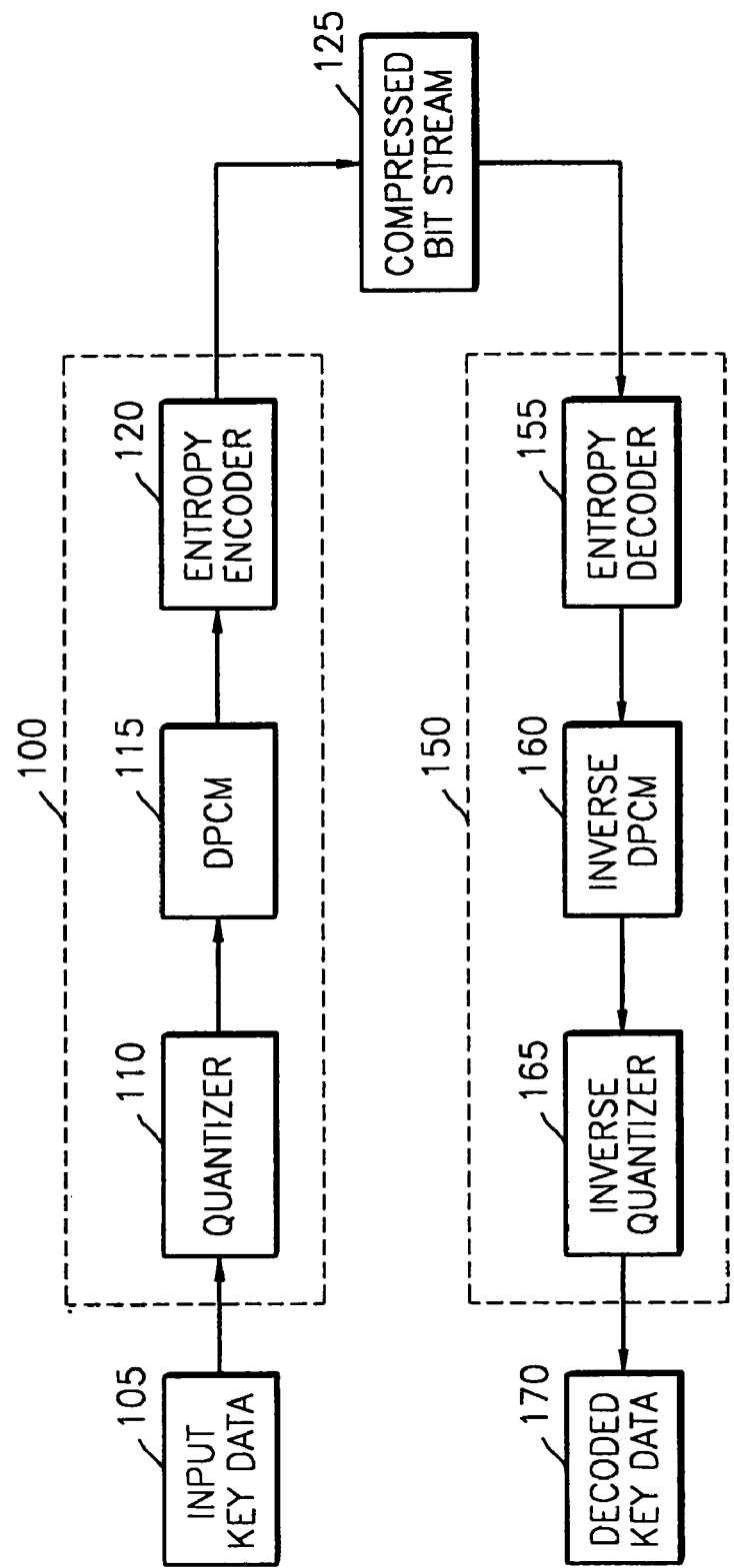
FIG. 1 is a block diagram of conventional key data encoder and key data decoder.
Figure 2B:
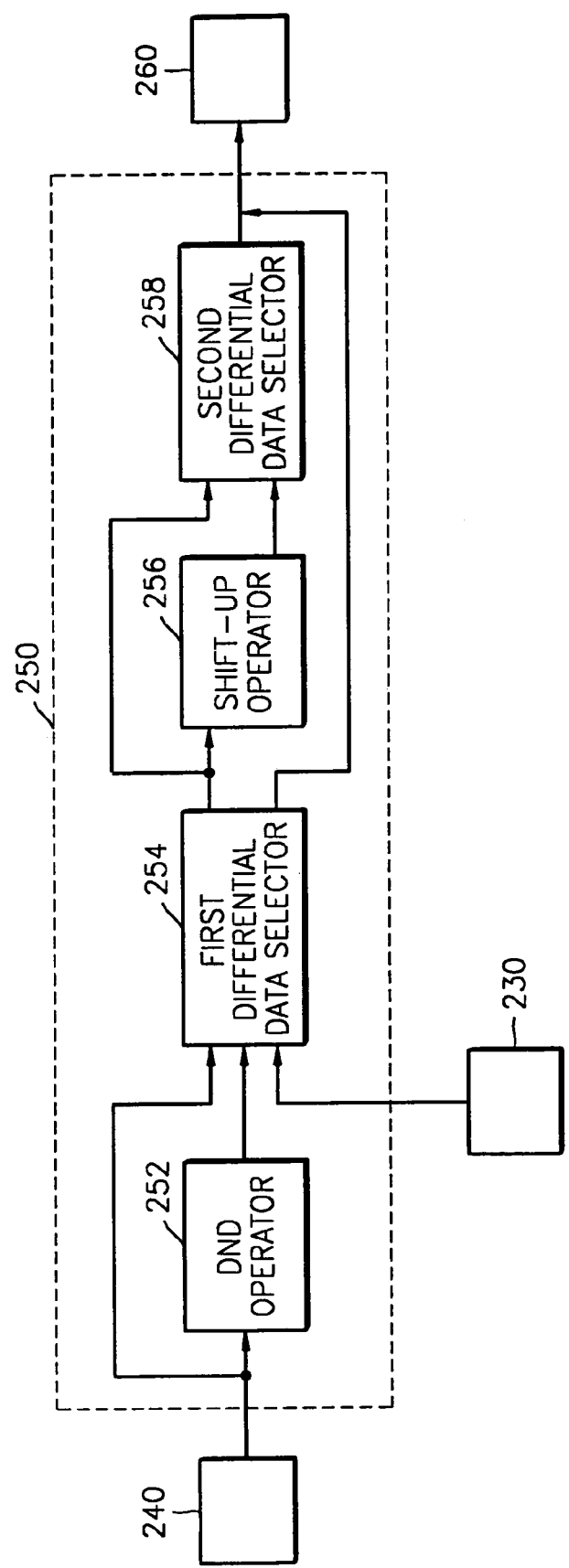
FIG. 2B is a block diagram of a divide-and-divide (DND) processor shown in FIG. 2A.

Referring to FIG. 2B, the DND processor 250 includes a DND operator 252 which performs a DND operation on differential data, a first differential data selector 254 which selects differential data to be entropy-encoded based on the number of bits for encoding, a shift-up operator 256 which performs a shift-up operation on the differential data having been through a DND operation, and a second differential data selector 258 which selects from between the differential data having been through only the DND operation and the differential data having been through the shift-up operation the ones that have a lower dispersion degree and outputs the selected differential data to the entropy encoder 260.

The DND operation performed in the DND operator 252 will be described in the following.

When the differential data having been through the folding operation in the folding processor 240 are input into the DND operator 252, they are divided in two groups, and a group of differential data having a higher range than the other group of differential data is moved to the positive number region by a divide function. The divide function is defined by the following equation.

$$\text{divide}(nQKey_j, nKeyMax) = nQKey_j - (nQKeyMax + 1) \quad \left(\text{if } nQKey_j > \frac{nKeyMax}{2}\right) \quad (10)$$
$$= nQKey_j \quad \left(\text{if } nQKey_j \leq \frac{nKeyMax}{2}\right)$$

Here, j indicates an index of input differential data, $nQKey_j$ indicates an array of integers, and nKeyMax indicates a maximum value among differential data having been through the folding operation. Especially, in a case where most differential data are densely populated along boundaries of the entire region accounted for by all differential data, it is possible to considerably reduce the entire region of all differential data using the divide operation.

After the divide operation, the degree of dispersion is calculated, in which case the size of bits required for encoding is used as a measure of the degree of dispersion so that a minimum value in the size of bits for encoding can be selected.

After the DND operation, a different kind of DND operation, i.e., a divide-up operation or a divide-down operation, is further performed. Whether a divide-up operation or a divide-down operation will be further performed is determined depending on both the size of a positive range of differential data and the size of a negative range of the differential data.

If the range of the differential data having positive values is larger than that of the differential data having negative values, a divide-down operation defined by the following equation is performed.

$$\text{divide-down}(nQKey_j, nKeyMax) = -2(nKeyMax - nQKey_j + 1) + 1 \quad \left(\text{if } nQKey_j > \frac{nKeyMax}{2}\right) \quad (11)$$
$$= nQKey_j \quad \left(\text{if } 0 \leq nQKey_j \leq \frac{nKeyMax}{2}\right)$$
$$= 2 \cdot nQKey_j \quad (\text{if } nQKey_j < 0)$$

On the other hand, if the range of the differential data having positive values is larger than the range of the differential data having negative values, a divide-up operation defined by the following equation is performed.

$$\text{divide-up}(nQKey_j, nKeyMin) = nQKey_j \quad (nQKey_j \geq 0) \quad (12)$$
$$= 2 \cdot nQKey_j \quad \left(\frac{nKeyMin}{2} \leq nQKey_j \leq 0\right)$$
$$= 2(nKeyMin - nQKey_j - 1) + 1 \quad \left(nQKey_j < \frac{nKeyMin}{2}\right)$$

In Equations (11) and (12), j indicates an index of quantized key data, $nQKey_j$ represents an array of integers, nKeyMax indicates a maximum value of $nQKey_j$, and nKeyMin indicates a minimum value of $nQKey_j$.

Figure 7:
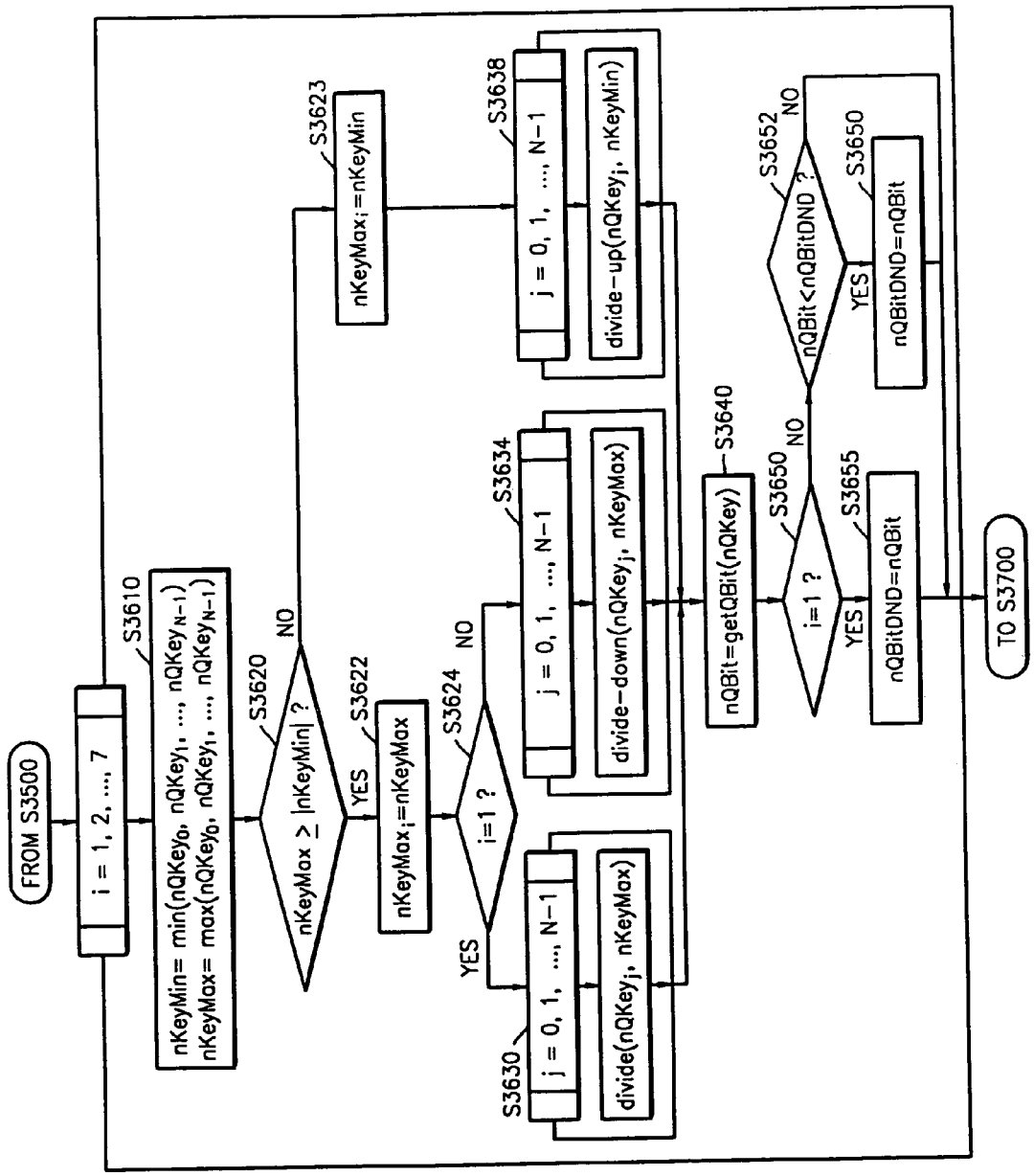
FIG. 7 is a flowchart of a DND operation process according to a preferred embodiment of the present invention.

The operation of the DND operator 252 will be described in the following with reference to FIG. 7.

When the differential data of the input key data are input from the folding processor 240, the DND operator 252 obtains the maximum value nKeyMax and the minimum value nKeyMin among the input differential data in step S3610. Then, the DND operator 252 compares the absolute value of nKeyMax with that of nKeyMin in step S3620. If nKeyMax is not smaller than the absolute value of nKeyMin, the DND operator 252 sets nKeyMax as a maximum value in the current cycle of DND operation in step S3622.

The DND operator 252 checks if the order of DND operation is 1, in other words, if the order of DND operation is 1, in step S3624, and if it is, the DND operator 252 performs a divide operation on the input differential data in step S3630 substituting the maximum value nKeyMax in Equation (10).

Thereafter, the DND operator 252 measures the size of bits required for encoding the differential data range having been reduced using the divide operation, in step S3640, using function getQBit ( ). If the order of DND operation turns out to be 1 in step S3650, the size of bits required for encoding is stored as a value nQBitDND indicating the minimum size of bits for encoding, and the order of DND operation is increased by 1 in step S3655.

Next, the DND processor 252 performs steps S3610 through S3622 again. If the order of DND operation is not 1 in step S3624, the DND operator 252 performs a divide-down operation in step S3634 substituting the maximum value nKeyMax in Equation (11). The DND operator 252 calculates the number of bits required for encoding the differential data having been through the divide-down operation, in step S3640. If the number is smaller than the minimum value nQBitDND stored in the previous cycle of DND operation, it replaces the minimum size of bits required for encoding after the DND operation in step S3658.

If the absolute value of the minimum value nKeyMin appears to be greater than that of the maximum value nKey- Max in step S3620, the maximum value in the current cycle of DND operation is renewed as a minimum value in step S3623, and then a divide-up operation is performed in step S3628 substituting the minimum value for nKeyMin in Equation 12. Thereafter, the DND operator 252 calculates the number of bits for encoding the differential data having been through the divide-up operation in step S3640. If the result of the calculation turns out to be smaller than nQBitDND that has been stored in the previous cycle of DND operation in step S3652, it replaces the minimum number nQBitDND of bits required for encoding after the DND operation in step S3658.

The DND processor 252 performs the DND operation a predetermined number of times, and the number of performance of the DND operation may vary. For example, in the present embodiment, the DND operation is performed 7 times. The DND operator 252 outputs nQBitDND and the differential data corresponding to nQBitDND to the first differential data selector 254. The DND operator 252 outputs the order of DND by which the corresponding differential data have been generated to the key header encoder 270 and allows them to be included in the bitstream.

The first differential data selector 254 receives the differential data having been through the shifting operation, the differential data having been through the folding operation, and the differential data having been through the DND operation and determines which differential data among the three will be entropy-encoded.

Referring to FIGS. 3A and 3B, the first differential data selector 254 selects the results of the DPCM and performs a shifting operation on them in step S3710 if the minimum number nQBitDND of bits required for encoding after the DND operation is no smaller than the size nQStep-DPCM of bits for encoding after the DPCM operation in step S3700. Next, the first differential data selector 254 outputs the results of the shifting operation to the entropy encoder 260 and allows them to be entropy-encoded in step S3710. In this case, the order of DND operation is set up as −1, is output to the key header encoder 270, and is included in the key header.

However, if it turns out in step S3720 that nQBitDND is smaller than nQStep-DPCM and is not smaller than the size of bits for encoding after the folding operation, the first differential data selector 254 outputs the differential data having been through the folding operation to the entropy encoder 260 and allows them to be entropy-encoded in step S3730, in which case the order of DND operation is set up at 0, is output to the key header encoder 270, and thus is included in the key header.

If the number of bits for encoding the differential data after the DND operation is smallest, the first differential data selector 254 outputs the differential data having been through the DND operation to the shift-up operator 256, and then the shift-up operator 256 calculates a first dispersion degree of the differential data input from the first differential data selector 254, in step S3740. Next, the shift-up operator 256 performs a shift-up operation defined by the following equation on the differential data having been through the DND operation, in step S3800 and calculates a second dispersion degree of the results of the shift-up operation in step S3810.

$$\text{shift-up}(nQKey_j, nKeyMax) = nQKey_j \quad \text{(if } nQKey_j \geq 0\text{)} \quad (13)$$
$$= nKeyMax - nQKey_j \quad \text{(if } nQKey_j < 0\text{)}$$

Here, j indicates an index of differential data of quantized key data, $nQKey_j$ indicates an array of integers, and nKeyMax indicates a maximum value among differential data.

When the differential data having been through the DND operation and the differential data having been through the shift-up operation are input, the second differential data selector 258 compares the first dispersion degree with the second dispersion degree in step S3900. If the second dispersion degree is smaller than the first dispersion degree the second differential data selector 258 outputs the differential data having been through the shift-up operation to the entropy-encoder 260 and allows them to be entropy-encoded in step S3910. The second differential data selector 258 outputs the maximum and minimum values nKeyMax and nKeyMin used in the DND operation, and the maximum value nKeyMax used in the shift-up operation to the key header encoder 270 and allows them to be included in the key header.

However, if the first dispersion degree is smaller than the second dispersion degree, the second differential data selector 258 outputs the differential data having been through the DND operation to the entropy encoder 260 and allows them to be entropy-encoded in step S3920. Then, the second differential data selector 258 outputs only the maximum and minimum values nKeyMax and nKeyMin used in the DND operation to the key header encoder 270. In a preferred embodiment of the present invention, standard deviation may used as a measure of the first and second dispersion degrees.

The entropy encoder 260 performs two different functions on differential data depending on the characteristics of the differential data. For example, differential data having been through a DPCM operation and a shifting operation and differential data having been through only a divide operation have both positive and negative values, and thus it is required to perform a process of encoding the sign of each of the differential data as well as the differential data themselves. On the other hand, since differential data having been through a folding operation only have positive values, a process of encoding only the differential data is performed.

In a preferred embodiment of the present invention, function encodeSignedAAC is used for encoding the differential data and their signs as well, and function encodeUnsignedMC is used for encoding only differential data.

FIG. 8 is a diagram of an example of function encodeSignedAAC. Referring to FIG. 8, when an input value is 74 and the number of bits for encoding the input value is 8, its sign is 0, and it is the same as a binary number of 1001010. Signs and all bit planes are encoded in the following way:

First step: a binary number is encoded on every bit plane in an order of from its most significant bit (MSB) to its least significant bit (LSB);

Second step: it is checked if the bit which is currently being encoded is 0;

Third step: if the bit currently being encoded is not 0, the sign of the binary number is encoded next; and Fourth step: the remaining bits of the binary number are encoded.

Function encodeUnsignedAAC encodes values not having a sign as an adaptive arithmetic encoding bitstream using a context regarding the values. This function is almost the same as function encode SignedAAC except that there exists a sign context.

FIGS. 9A through 9J are graphs showing key data which have been subjected to operations according to a preferred embodiment of the present invention. In FIGS. 9A through 9J, the X-axis represents indexes of each of the key data, and the Y-axis represents the values of the key data.

Figure 9A:
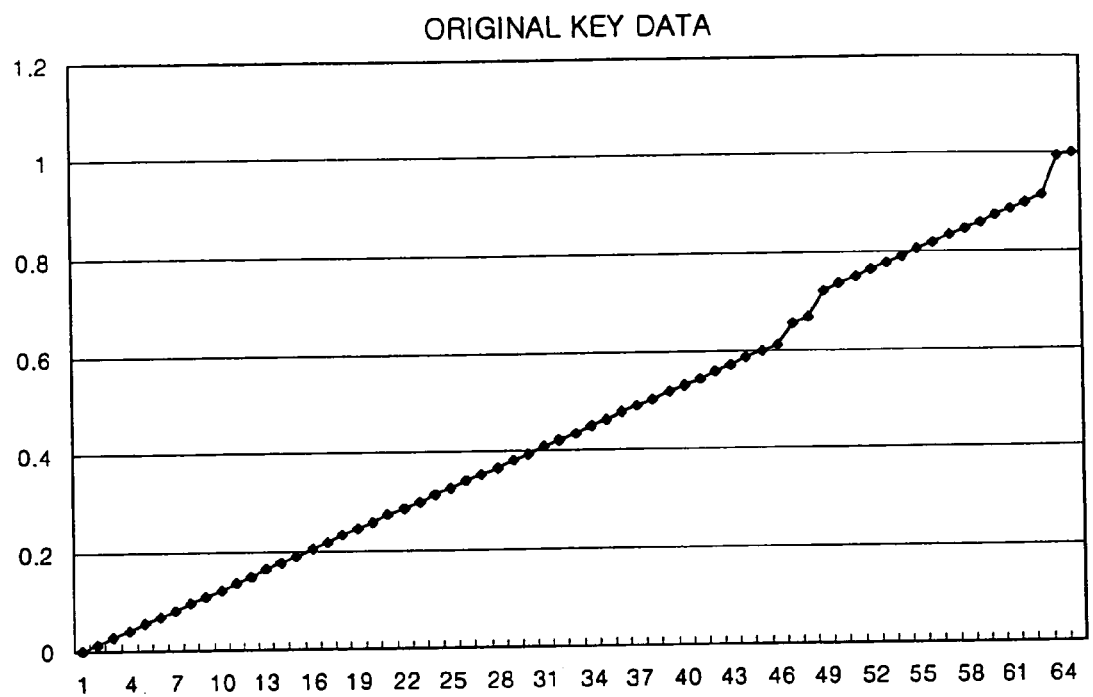
FIGS. 9A through 9J are graphs showing key data having been through different operations according to a preferred embodiment of the present invention.
Figure 9B:
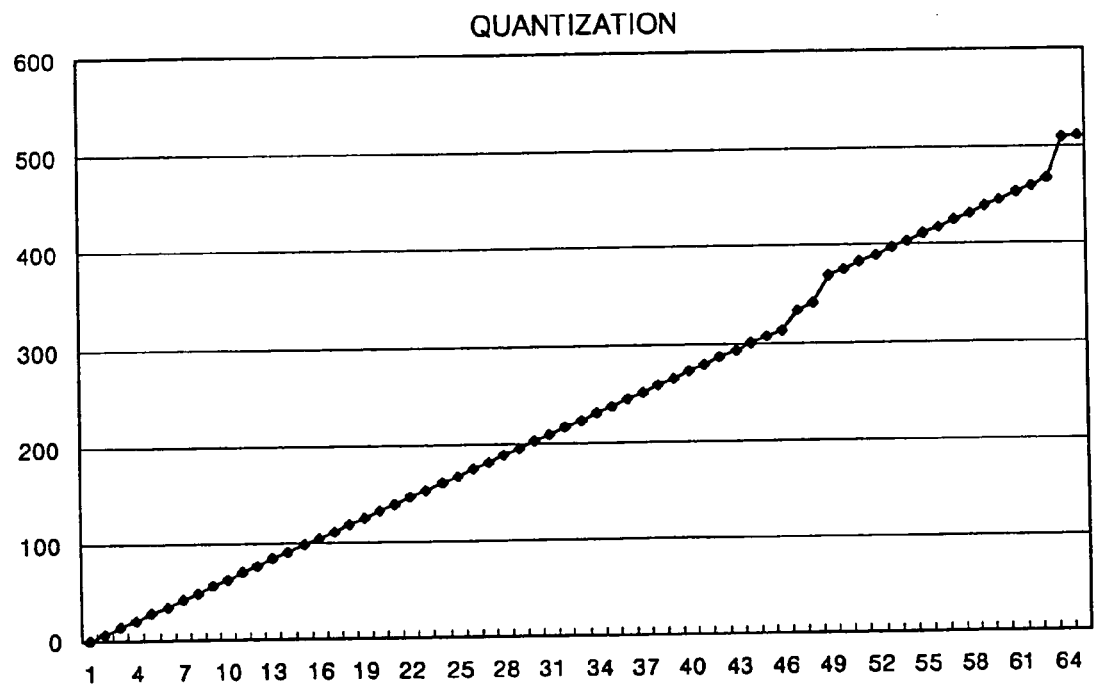
Figure 9C:
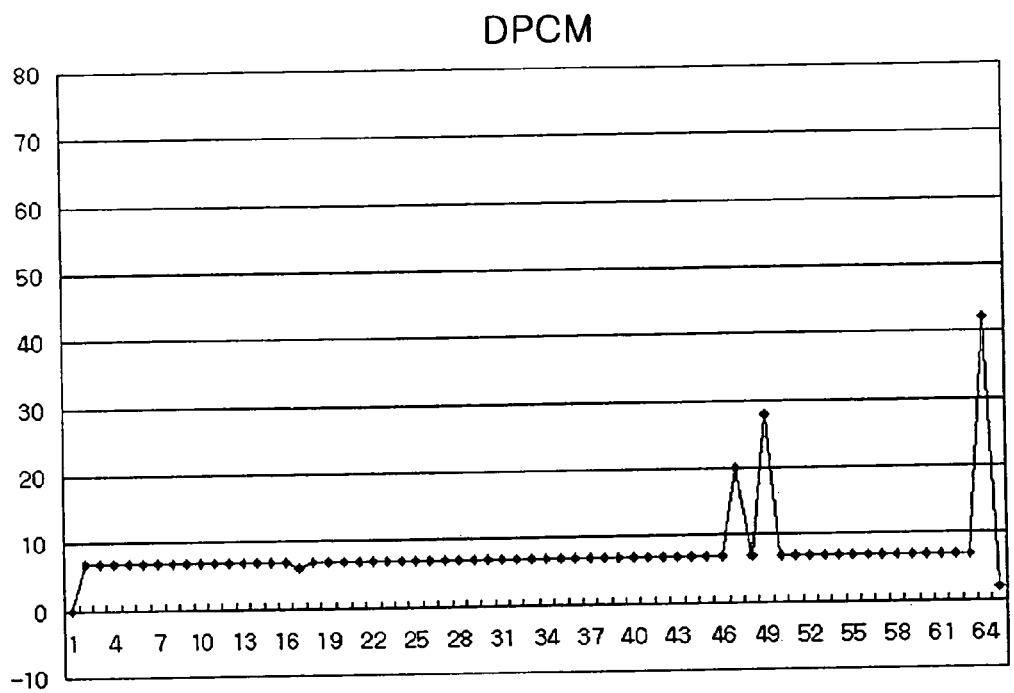

FIG. 9A is a graph showing original key data input into the encoder of the present invention. The key data shown in FIG. 9A are output to the quantizer 210 and then are quantized with nine quantization bits so that quantized key data shown in FIG. 9B are obtained. If DPCM is performed on the quantized key data shown in FIG. 9B, differential data shown in FIG. 9C are obtained.

Figure 9D:
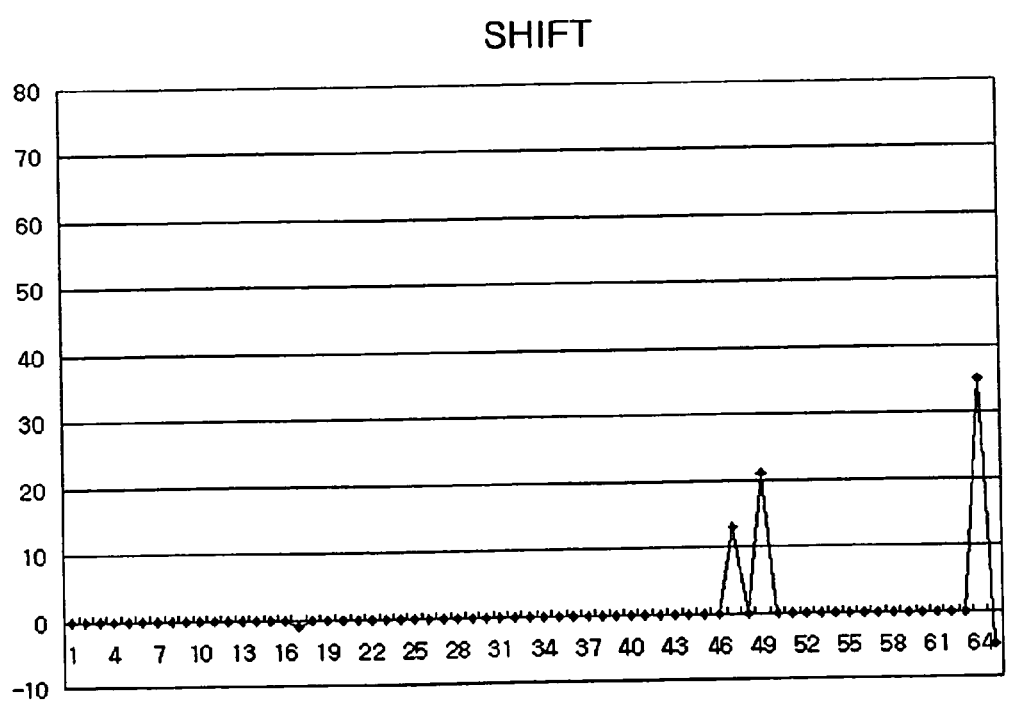

Next, the differential data of the quantized key data are shifted using a mode value of about 7 so that differential data shown in FIG. 9D are obtained. Thereafter, if a folding operation is performed on the shifted differential data, data having only positive values can be obtained, as shown in FIG. 9E.

Figure 9E:
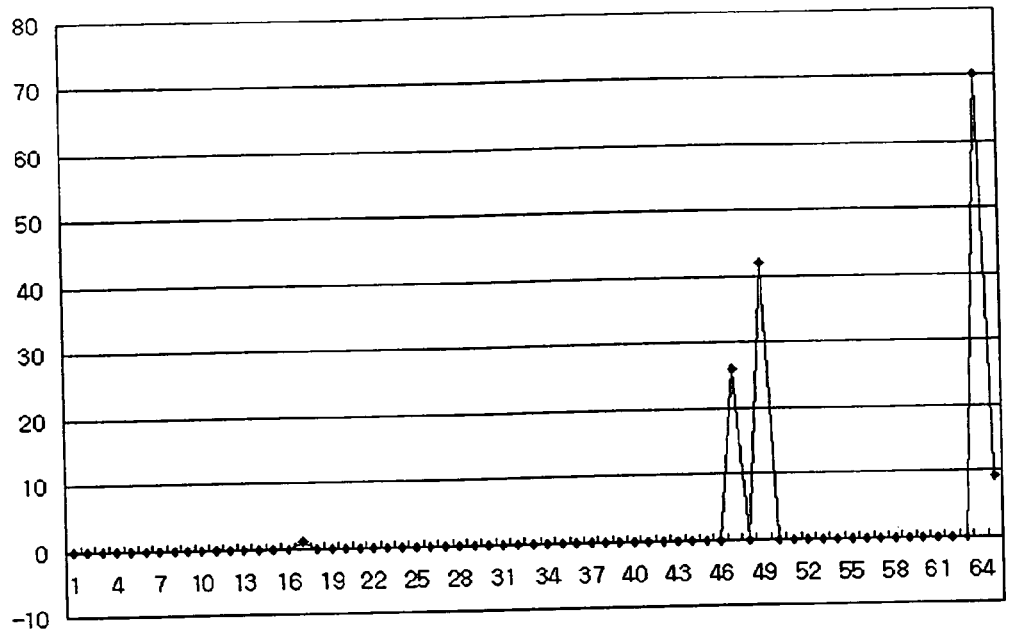
Figure 9F:
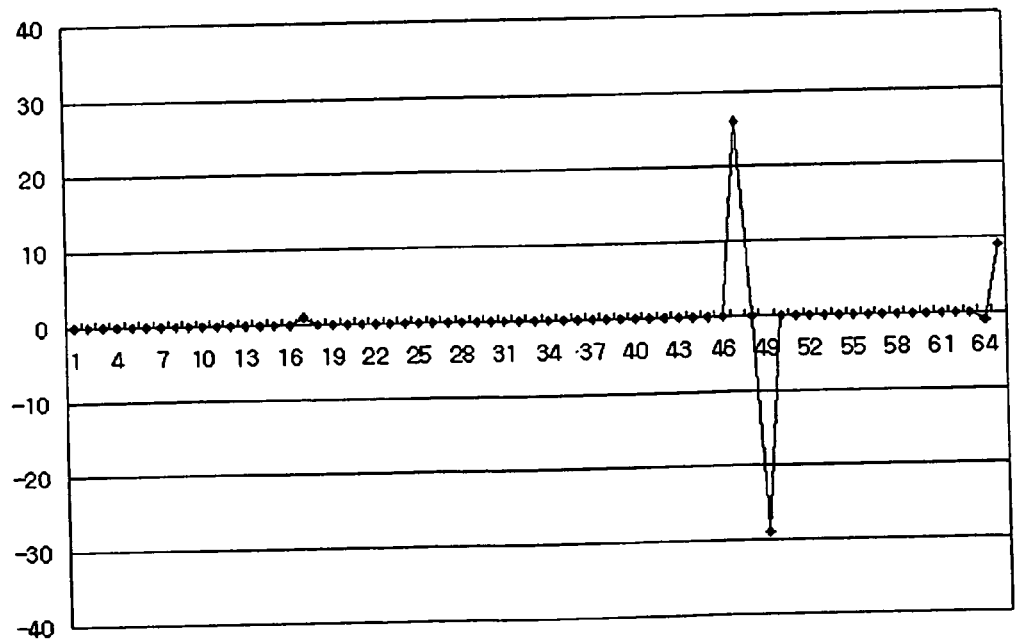
Figure 9G:
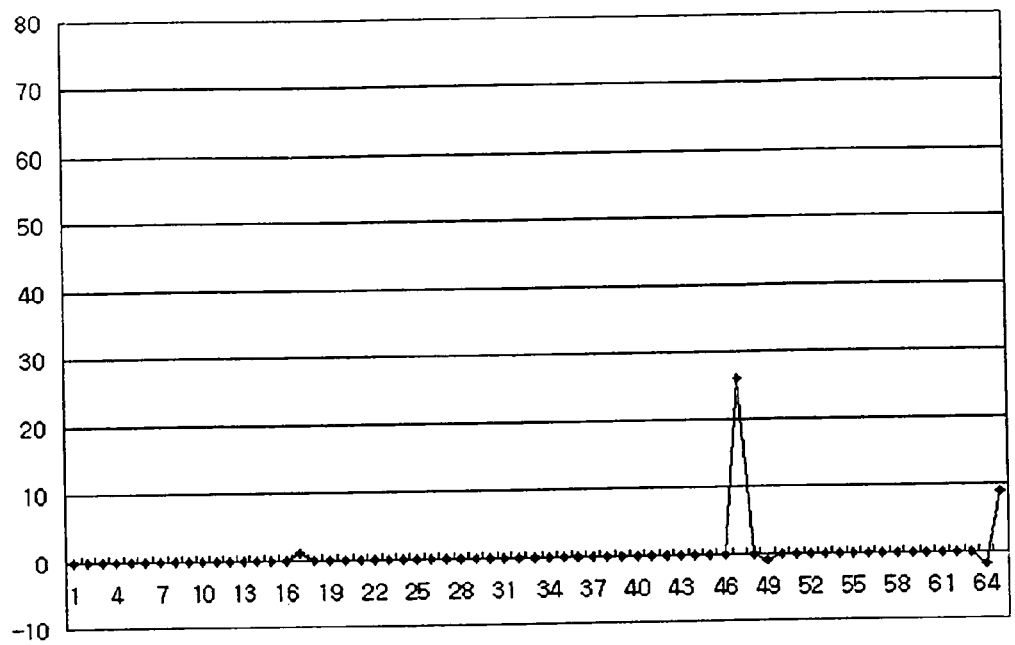
Figure 9H:
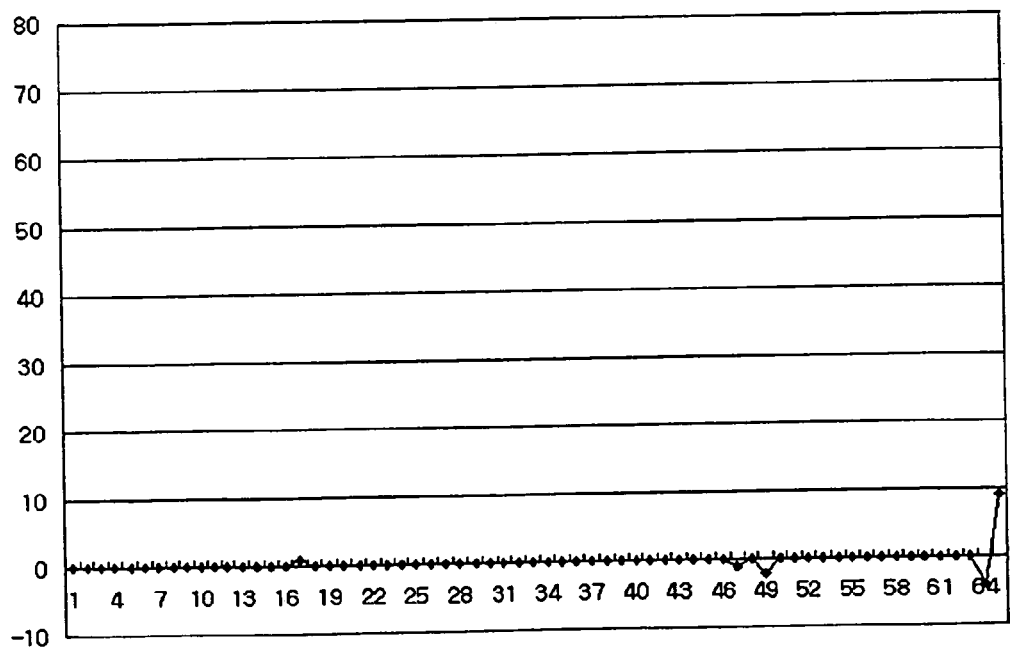

The results of performing a DND operation on the folded data shown in FIG. 9E are shown in FIGS. 9F through 9H. In particular, the results of performing a divide operation on the folded data are shown in FIG. 9F. As shown in FIG. 9F, positive key data values range from 0 to 28, and negative key data values range from −29 to 0, which means that the range of negative key data values is greater than that of positive key data values. Accordingly, it is required to perform a divide-up operation on the data shown in FIG. 9F, and the results of the divide-up operation are shown in FIG. 9G.

Figure 9I:
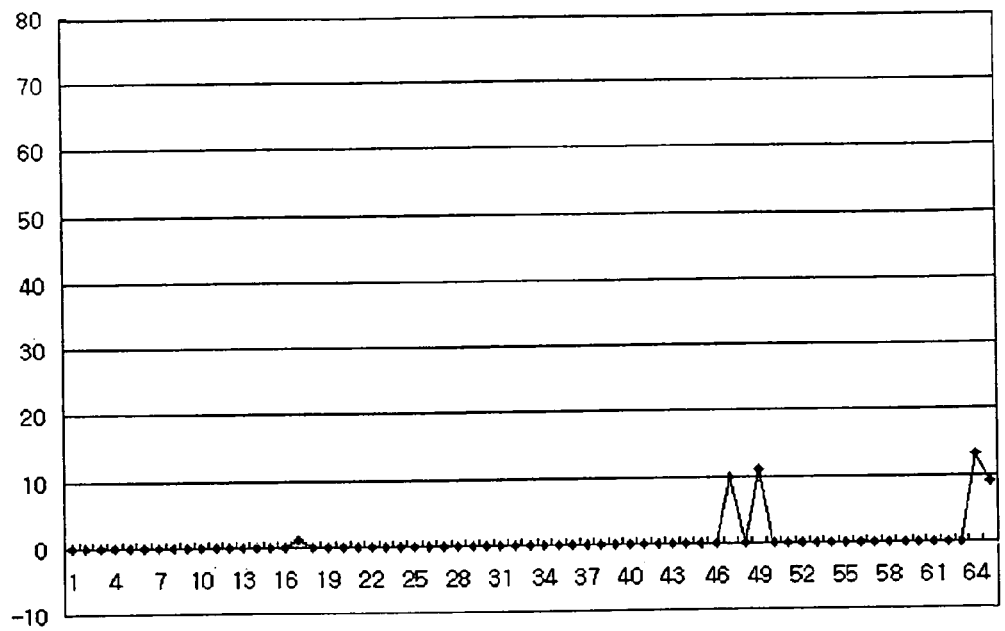

As a result of the divide-up operation, the range of negative key data values is considerably reduced so that it is much smaller than the range of positive key data values. In a subsequent cycle of DND operation, a divide-down operation is performed on the results of the divide-up operation. FIG. 9H is a diagram showing the results of performing a divide-down operation on the differential data shown in FIG. 9G. The results of performing a shift-up operation on the key data shown in FIG. 9H are shown in FIG. 9I.

Figure 9J:
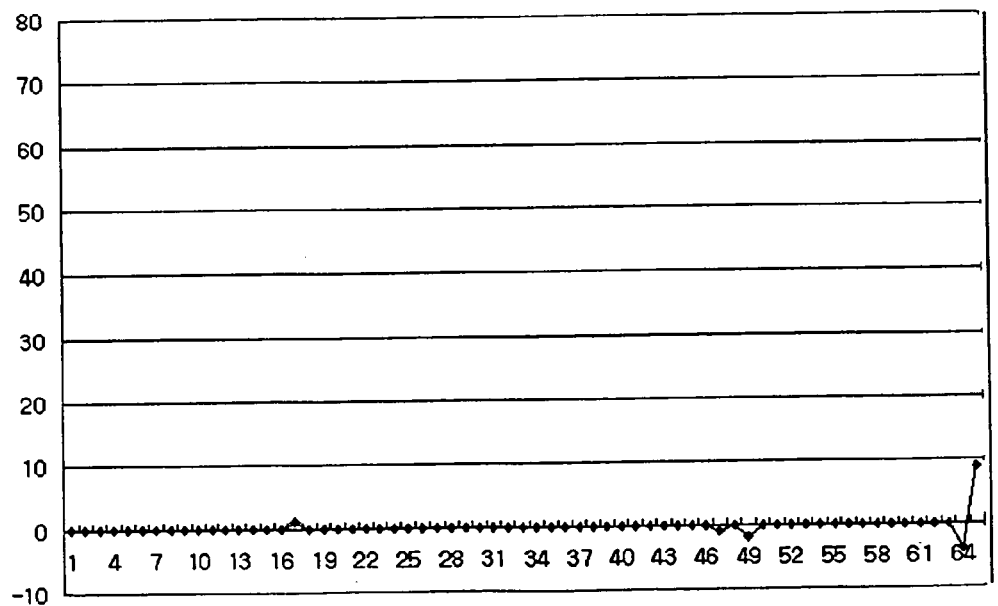

As shown in FIGS. 9A through 9G, the range of key data and differential data gradually decreases. However, as shown in FIGS. 9H and 9I, the range of differential data is increased greater after the shift-up operation than before, which shows that the differential data having been through the divide-down operation, as shown in FIG. 9H, are the ones that are to be finally encoded, as shown in FIG. 9J.

The information encoded in the key header encoder 270 and stored in the key header will be described in the following.

When key data to be encoded are input, the key header encoder 270 encodes the digit number of key data and the number of keys to be encoded. Next, the key header encoder 270 receives information on whether or not there exists a linear key data region that has been through the linear key-encoding in the input key data and the number of key data in the linear key data region from the linear key encoder 200 and receives the beginning and ending key data of the linear key data region that has been through the floating-point number conversion from the floating-point number converter 205.

In a case where the floating-point number converter 205 receives maximum and minimum values which can bring about a minimum quantization error and converts them into floating-point numbers, the converted maximum and minimum values are input into the key header encoder 270 from the floating-point number converter 205 so that they can be used again for inverse quantization. In addition, the size of quantization bits is also input into the key header encoder 270 and is included in the key header.

The key header encoder 270 receives the order of DPCM and intra key data in each cycle of DPCM from the DPCM processor 220 and receives a mode value which has been used for a shifting operation from the shifter 230. In addition, the key header encoder 270 receives from the DND processor 250 information on whether or not a shift-up operation has been performed, the order of DND by which the dispersion degree of differential data can be minimized, and maximum and minimum values in each cycle of DND operation.

Finally, the key header encoder 270 receives the number of bits used for encoding from the entropy encoder 260 and encodes it as a key header.

An example of the key data encoder according to a preferred embodiment of the present invention has been described above. It is obvious to one in the art that the present invention may be embodied in various ways. Hereinafter, other examples of the key data encoder according to other preferred embodiments of the present invention, which are capable of increasing the efficiency of encoding key data, will be described more fully with reference to FIGS. 2C through 2G. In FIGS. 2A through 2G, the same reference numerals indicate the same elements.

Figure 2C:
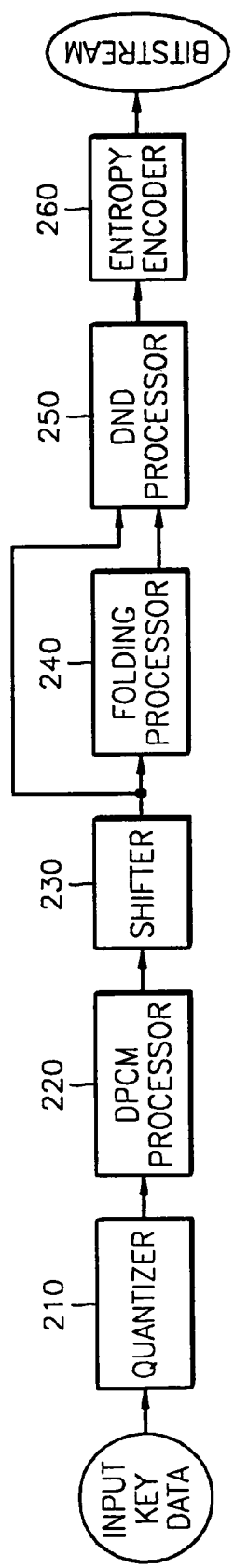

Referring to FIG. 2C, a key data encoder according to another preferred embodiment of the present invention includes a quantizer 210, a DPCM processor 220, a shifter 230, a folding processor 240, a DND processor 250, and an entropy encoder 260.

Key data input into the key data encoder are input into the quantizer 210 first and quantized into predetermined quantization bits. The quantized key data are input into the DPCM processor 220. Then, the DPCM processor 220 performs a DPCM operation on the quantized key data and outputs the results of the DPCM operation, i.e., differential data, to the shifter 230. The shifter 230 obtains a differential datum (a mode) having the highest frequency among the differential data and performs a shifting operation in which the mode is subtracted from each of the differential data. Next, the shifter 230 outputs the results of the shifting operation to the folding processor 240. The folding processor 240 converts the differential data input from the shifter 230 into either a positive or negative number region and outputs the results of the conversion to the DND processor 250. The DND processor 250 performs a DND operation on the differential data input from the folding processor 240. Next, the DND processor 250 selects from among the differential data having been through the shifting operation, the differential data having been through the folding operation, and the differential data having been through the DND operation the ones which can minimize the number of bits for encoding and outputs the selected differential data to the entropy encoder 260 so that the key data can be encoded. Here, the DND processor 250 may not perform a shift-up operation on the differential data having been through the DND operation, and the key data encoder shows a much higher encoding efficiency than conventional key data encoders.

Figure 2D:
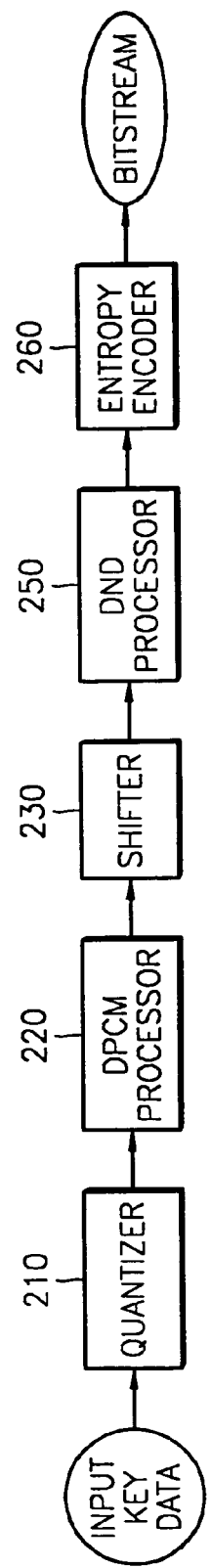

Referring to FIG. 2D, a key data encoder according to another preferred embodiment of the present invention includes a quantizer 210, a DPCM processor 220, a shifter 230, a DND processor 250, and an entropy encoder 260.

Key data are input into the quantizer 210 first and are quantized with predetermined quantization bits. The quantized key data are input into the DPCM processor 220. Then, the DPCM processor 220 performs a DPCM operation on the quantized key data and outputs the results of the DPCM operation, i.e., differential data to the shifter 230. The shifter 230 obtains a differential datum (a mode) having the highest frequency among the differential data and performs a shifting operation in which the mode is subtracted from each of the differential data. Next, the shifter 230 outputs the results of the shifting operation to the DND processor 250. The DND processor 250 performs a DND operation on the shifted differential data input from the shifter 230. Next, the DND processor 250 figures out which differential data have a smaller number of bits required for encoding between the differential data having been through the shifting operation and the differential data having been through the DND operation. If the differential data having been through the DND operation turn out to have a smaller number of its required for encoding, the DND processor 250 performs a shift-up operation on them. Next, the DND processor 250 selects from between the differential data having been through the shift-up operation and the differential data having been through the DND operation the ones having a smaller number of bits required for encoding. Then, the DND processor 250 outputs the selected differential data to the entropy encoder 260. The entropy encoder performs entropy encoding on the differential data input from the DND processor 250, thus generating a bitstream. The key data encoder in the present embodiment shows a much higher encoding efficiency than conventional key data encoders even though it does not perform a folding operation.

Referring to FIG. 2E, a key data encoder according to another preferred embodiment of the present invention encodes differential data and outputs them when the differential data of key data are input.

The key data encoder includes a shifter 230, a folding processor 240, a DND processor 250, and an entropy encoder 260. A differential datum having the highest frequency among input differential data is subtracted from the input differential data in the shifter 230, and the results of the subtraction are output to the folding processor 240. The folding processor 240 converts the differential data output from the folding processor 240 into either a positive or negative number region and outputs the results of the conversion to the DND processor 250. The DND processor 250 performs a DND operation on the differential data input from the folding processor 240 and figures out which differential data can minimize the number of bits required for encoding among the differential data having been through the shifting operation, the differential data having been through the folding operation, and the differential data having been through the DND operation. If the differential data having been through the shifting operation or the folding operation are considered capable of minimizing the number of bits required for encoding, the DND processor 250 outputs them to the entropy encoder 260 so that the key data can be encoded. On the other hand, in a case where the differential data having been through the DND operation are selected, the DND processor 250 performs a shift-up operation on them. Next, the DND processor 250 selects from between the differential data having been through the DND operation and the differential data having been through the shift-up operation the ones having a smaller number of bits required for encoding. Next, the selected differential data are output to the entropy encoder 260. The entropy encoder 260 encodes the outputs of the DND operation 250, thus generating a bitstream. The key data encoder in the present embodiment also shows a much higher encoding efficiency than conventional key data encoders.

FIG. 2F is a block diagram of a key data encoder according to another preferred embodiment of the present invention. Referring to FIG. 2F, the key data encoder includes a DND operator 252, a shift-up operator 256, a differential data selector 258b, and an entropy encoder 260.

The DND operator performs a DND operation, which has been described above, on differential data of key data input thereinto and outputs the DNDed differential data to the shift-up operator 256 and the differential data selector 258b. The shift-up operator 256 performs a shift-up operation, which has been described above, on the DNDed differential data input from the DND operator 252 and then outputs the results of the shift-up operation to the differential data selector 258b. The differential data selector 258b compares the number of bits required for encoding the DNDed differential data input from the DND operator 252 with the number of bits required for encoding the differential data input from the shift-up operator 256 and outputs the ones having a smaller number of bits required for encoding to the entropy encoder 260 so as to make a bitstream of key data be output. The key data encoder in the present embodiment also shows a much higher encoding efficiency than conventional key data encoders.

Figure 2G:
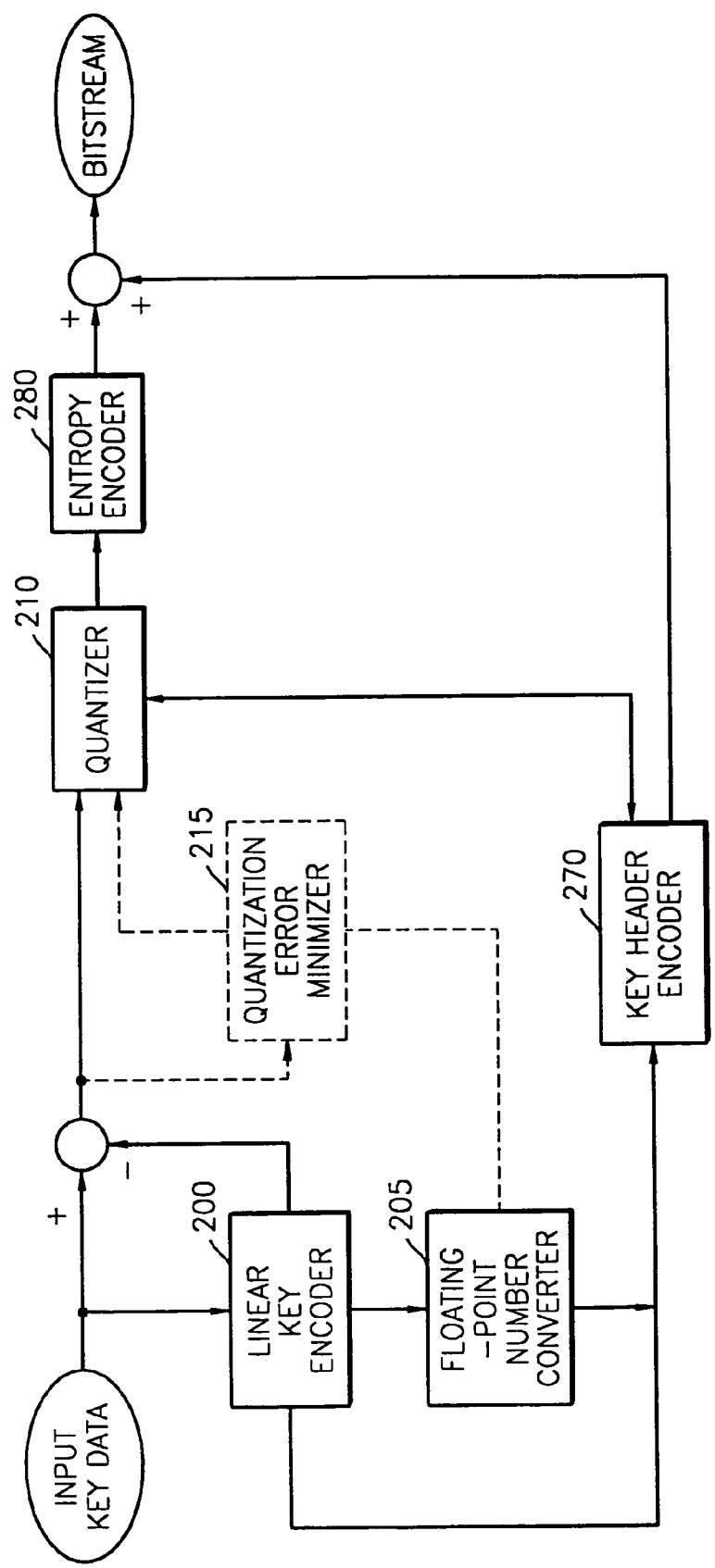

In FIG. 2G, a key data encoder according to another preferred embodiment of the present invention, which can increase the efficiency of encoding key data by identifying a linear key data region in input differential data, is shown. The key data encoder includes a linear key encoder 200, a floating-point number converter 205, a quantizer 210, an entropy encoder 280, and a key header encoder 270.

When key data are input into the key data encoder shown in FIG. 2G, the linear key encoder 200 searches for a region where key data linearly increases, i.e., a linear key data region, in the input key data and outputs the beginning and ending key data of the linear key data region to the floating-point number converter 205. The input key data except for the linear key data region are input into the quantizer 210. The key data input into the quantizer 210 are quantized with predetermined quantization bits and are output to the entropy encoder 280. The entropy encoder 280 encodes the quantized key data input from the quantizer 210 by performing a predetermined operation on them and thus outputs the results of the operation as a bitstream.

The floating-point number converter 205 converts the beginning and ending key data of the linear key data region which are represented by binary numbers into the decimal system and outputs the results of the conversion to the key header encoder 270 so that they can be included in the bitstream. The key data encoder in the present embodiment may further include a quantization error minimizer 215.

Figures 10A, 10B:
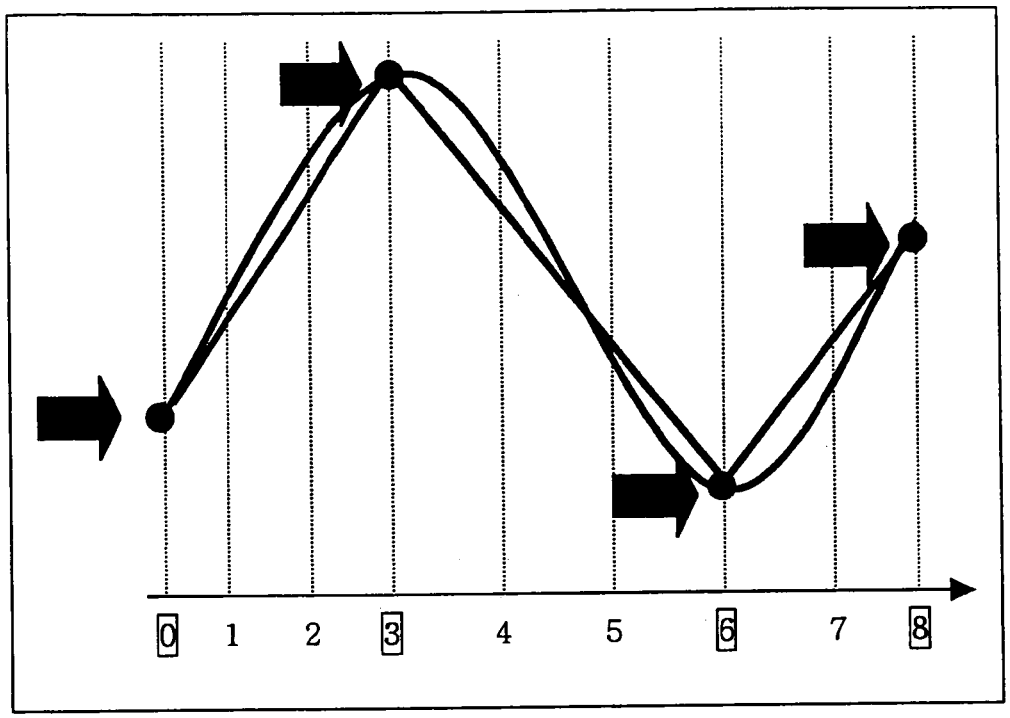
FIGS. 10A and 10B are diagrams illustrating a process of encoding animation data using key data and key value data.

A process of encoding animation data using key data and key value data will be described more fully with reference to FIGS. 10A and 10B.

In an animation path of key values, a key value encoder searches a set of points representing almost the same animation path as that of the key values, in which case a considerable number of key values can be decreased and the rest are represented by key selection flags. For example, supposing that key values are given showing a curved line shown in FIG. 10A and four points are selected, key selection flags have some values, as shown in FIG. 10B. Such key selection flags are encoded by the entropy encoder 260 so that only the key value data corresponding to the key selection flags are encoded.

An example of SDL program codes and variables that have been used for the aforementioned encoding process will be described more fully with reference to FIGS. 14A through 14E.

Program codes of class key header are shown in FIG. 14A. Variables used in the program codes will be described first.

Key header data are pieces of information required for decoding key data. The main information of the key header includes the number of keys, a quantization bit, intra key data, a DND header, and the number of bits required for decoding nKeyQBit indicates a quantization bit used for inverse quantization, which restores floating-point number key values, nNumKeyCodingBit indicates the bit size of nNumberOfKey representing the number of key data, and nKeyDigit indicates the maximum number of significant digits of original key data and is used for rounding off the decoded value. In a case where information on a linear key data region is included in the key header, flag bIsLinearKeySubRegion is set at 1, in which case some keys included in a predetermined sub-region within the entire range of keys can be calculated using decoded header information following the flag bisLinearKey- SubRegion. bRangeFlag represents whether or not the range of the key data is between 0 and 1. If the key data does not range from 0 to 1, minimum and maximum values are decoded from class KeyMinMax. Class KeyMinMax reconstitutes maximum and minimum values for inverse quantization. Each of the maximum and minimum values can be divided into their mantissas and exponents. nBitSize indicates the bit size of bQIntraKey, and nKeyShift indicates the original bit size of nKeyMax. nQIntraKey indicates the size of first quantized intra data, is coupled with nQIntraKeySign representing the sign of nQIntraKey, and is used as a base for recovering other quantized key data. Among sign bits used for interpolator compression, 0 indicates positive values and 1 indicates negative values. nKDPCMOrder is the same as the result of subtracting 1 from the order of DPCM. The order of DPCM ranges from 1 to 3 and is the same as the number of intra data.

nkeyShift is an integer representing the amount of shift in a key data decoder, together with sign bit nKeyShiftSign. nKeyShift and nKeyShiftSign are decoded when bShiftFlag is set at 1. nDNDOrder is the order of DND. DND will be described in greater detail later with a key data decoder according to a preferred embodiment of the present invention. If nDNDOrder is 7, bNoDND is decoded. This Boolean value nDNDOrder represents information on whether or not inverse DND is performed. nKeyMax and nKeyMin indicate maximum and minimum values, respectively, used in consecutive cycles of DND operation. nKeyCodingBit is a bit used for encoding key data. bSignedAACFlag shows which decoding method will be used for AAC decoding. If bSignedMCFlag is 0, unsignedAAC decoding is performed, and if not, signedAAC decoding is performed. bKeyinvertDownFlag is a Boolean value representing information on whether or not nKeyInvertDown will be used. nKeyInvertDown is an integer and inverses quantized key data over the integer so that the quantized key data are converted into native values of no greater than −1. If nKeyInvertDown is −1, a shift-down operation is not performed.

FIG. 14B is a diagram showing program codes of class LinearKey. In FIG. 14B, nNumLinearKeyCodingBit is a value representing the number of bits required for encoding a predetermined number of keys which can be linearly predicted.

FIG. 14C is a diagram showing program codes of class KeySelectionFlag. In FIG. 14C, keyFlag is a Boolean array and represents information on whether or not an i-th key value has been decoded. nNumOfKeyValue is an integer representing the number of key values to be decoded.

FIG. 14D is a diagram showing program codes of class KeyMinMax. In FIG. 14D, bMinKeyDigitSame represents whether or not the number of most significant digits of all keys is the same as the number of most significant digits of a maximum value among the keys. nMinKeyDigit indicates the number of most significant bits of the maximum value among the keys. nMinKeyMantissaSign indicates the sign of nMinKeyMantissa. NMinKeyMantissa indicates the mantissa of a minimum value among the keys.

nMinKeyExponentSign refers the sign of nMinKeyExponent. nMinKeyExponent indicates the exponent of the minimum value among the keys.

fKeyMin indicates the minimum value among the keys. nMaxKeyDigitSame represents whether or not the number nKeyDigit of most significant digits of all the keys is the same as the number of most significant digits of the maximum value among the keys. nMaxKeyDigit indicates the number of most significant digits of the maximum value among the keys. nMaxKeyMantissaSign indicates the sign of nMaxKeyMantissa. nMaxKeyMantissa indicates the mantissa of the maximum value among the keys.

bSameExponent represents whether or not the exponent of the maximum value among the keys is the same as nMinKeyExponent. nMaxKeyExponentSign indicates the sign of nMaxKeyExponent. nMaxKeyExponent indicates the exponent of the maximum value among the keys. fKeyMax indicates the maximum value among the keys.

FIG. 14E is a diagram showing program codes of class Key. In FIG. 14E, nQKey indicates an array of quantized key data to be decoded from a bitstream. KeyContext indicates a certain context used for reading the size of nQKey. KeySignContext indicates a context used for reading the sign of nQKey.

decodeUnsignedAAC is a function for performing unsigned decoding using a given context, which will be described more fully in the following, and decodeSignedAAC is a function for performing signed decoding using another given context, which will be described later.

Hereinafter, an apparatus and a method for decoding key data according to a preferred embodiment of the present invention will be described with reference to FIGS. 11A and 12.

Figure 11A:
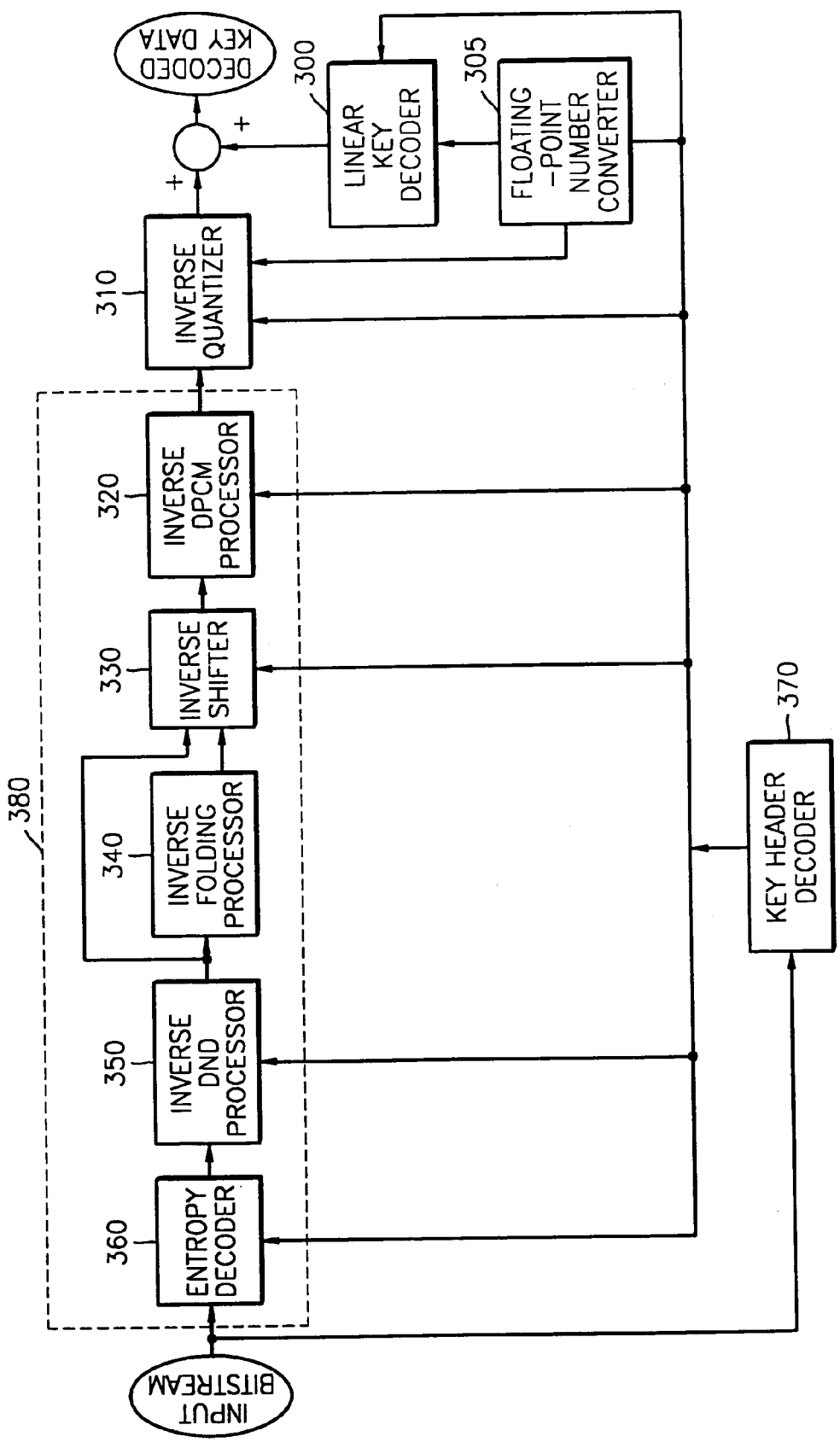
FIG. 11A is a block diagram of a key data decoder according to a preferred embodiment of the present invention.

FIG. 11A is a block diagram of an apparatus for decoding key data according to a preferred embodiment of the present invention. The apparatus for decoding key data receives an encoded bitstream and reconstitutes it into key data by decoding.

The apparatus for decoding key data includes a key header decoder 370 and a key data decoder. The key data decoder includes an entropy decoder 360, an inverse DND processor 350, an inverse folding processor 340, an inverse shifter 330, an inverse DPCM processor 320, an inverse quantizer 310, a linear key decoder 300, and a floating-point number inverse converter 305.

Figure 12:
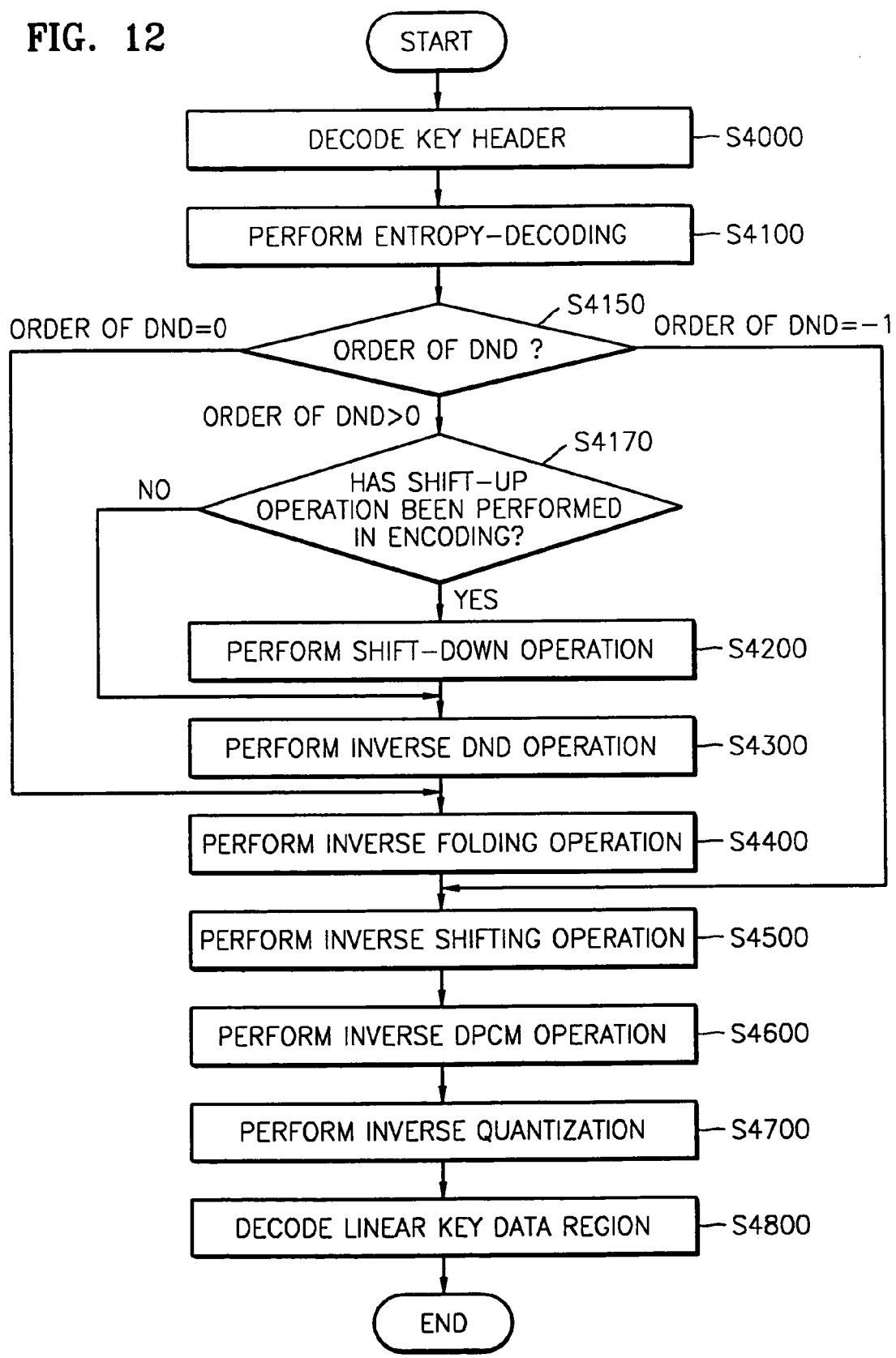
FIG. 12 is a flowchart of a method for decoding key data according to a preferred embodiment of the present invention.

FIG. 12 is a flowchart of a method for decoding key data according to a preferred embodiment of the present invention. Referring to FIGS. 11A and 12, a bitstream, into which key data are compressed, is input into the key header decoder 370 and the entropy decoder 360.

The key header decoder 370 decodes pieces of information required for each step of decoding and provides them to their corresponding steps of decoding in step S4000. The information decoded by the key header decoder 370 will be described with each decoding step.

The entropy decoder 360 receives the number of differential data to be decoded and the number of bits that have been used for encoding, i.e., the number of bits to be used for decoding, from the key header decoder 370 and decodes the input bitstream in step S4100. The number of differential data is equal to the result of subtracting the number of intra key data obtained by performing DPCM from the number of key data.

The entropy decoder 360 identifies if the differential data to be decoded have negative values or positive values based on predetermined information included in the bitstream, for example, bSignedAACFlag in the present embodiment. If the encoded differential data have negative values, the entropy decoder 360 decodes them using function decodeSignedAAC( ). On the other hand, if the encoded differential data have only positive values, the entropy decoder 360 decodes them using function decodeUnsignedAAC( ). Thereafter, the decoded differential data are transmitted to the inverse DND processor 350.

An example of program codes for realizing such functions for decoding a bitstream according to a preferred embodiment of the present invention will be described later.

The inverse DND processor 350 receives the order of DND and a maximum value nKeyMax in each cycle of DND from the key header decoder 370.

If the order of DND is −1, this means that the encoded differential data being decoded have been entropy-decoded going through a DPCM operation and a shifting operation instead of going through DND, and the method directly moves onto a step of performing an inverse shifting operation. If the order of DND is 0, this means that the encoded differential data being decoded have been entropy-decoded going through a folding operation instead of going through DND, and thus the method directly moves onto a step of performing an inverse folding operation. If the order of DND is greater than 0, an inverse DND operation is performed in step S4150.

The inverse DND processor 350 determines whether or not the encoded differential data being decoded have been encoded going through a shift-up operation in step S4170. In a preferred embodiment of the present invention, it is determined whether or not the encoded differential data being decoded have been encoded going through a shift-up operation by checking whether or not nKeyInvertDown included in a bitstream is greater than 0.

If the encoded differential data being decoded have not been through a shift-up operation, the method moves onto a step of performing an inverse DND. On the other hand, if the encoded differential data being decoded have been through a shift-up operation, the differential data that have been transferred from a positive number region to a negative number region by performing a shift-up operation are moved back to the negative number region in step S4200. In a preferred embodiment of the present invention, the differential data having been through a shift-up operation are restored by performing a shift-down operation (an invert-down operation) which is expressed by the following equation.

$$\text{invert-down}(v) = v \quad (\text{if } v \leq nKeyInvertDown) \quad (14)$$
$$= nKeyInvertDown - v \quad (\text{if } v > nKeyInvertDown)$$

Here, nKeyInvertDown has the same value as the maximum value nKeyMax used in the shift-up operation. As a result of the shift-down operation, the differential data having a value over nKeyInvertDown are converted into negative values below −1.

An inverse divide-down operation or an inverse divide-up operation is selectively performed on the differential data having been through the shift-down operation depending on the maximum value nKeyMax in each cycle of DND.

Figure 13:
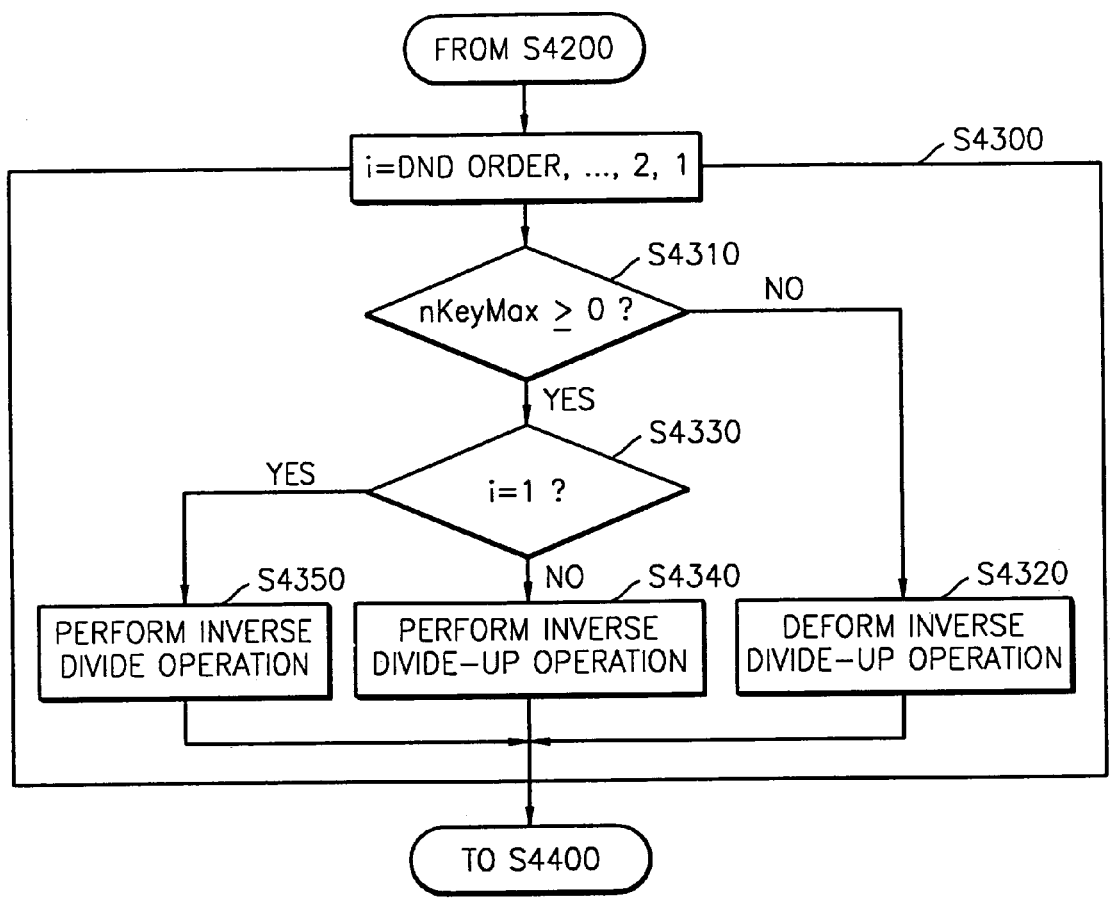
FIG. 13 is a flowchart of an inverse DND operation process according to a preferred embodiment of the present invention.

Referring to FIG. 13, the inverse DND processor 350 performs an inverse DND operation as many times as the differential data have been through a DND operation during encoding. In other words, the inverse DND processor 350 sets up an initial value of the order of inverse DND to be equal to the order of DND. Next, the inverse DND processor 350 subtracts 1 from the initial value of the order of inverse DND every time it performs an inverse DND operation and keeps performing the inverse DND operation until the order of inverse DND becomes 1. The inverse DND processor 350 searches for nKeyMax in each cycle of DND and checks whether or not each nKeyMax is not smaller than 0 in step S4310.

If nKeyMax is smaller than 0, it means that a divide-up operation has been performed in the process of encoding, and thus the inverse DND processor 350 extends the range of the differential data being decoded to a negative number region by performing an inverse divide-up operation, in step S4320.

In a preferred embodiment of the present invention, an inverse divide-up operation which is defined by Equation (15) may be used.

$$\text{inverse-divide-up}(v) = v \quad (\text{if } v \geq 0) \quad (15)$$
$$= (nKeyMax_i - 1) - \frac{v-1}{2} \quad (\text{if } v < 0, v \bmod 2 \neq 0)$$
$$= \frac{v}{2} \quad (\text{if } v < 0, v \bmod 2 = 0)$$

However, if nKeyMax is not smaller than 0, the inverse DND processor 350 checks if the order of inverse DND is 1. If the order of inverse DND is not 1, it means that a divide-down operation has been performed on the differential data being decoded in the process of encoding, and thus the inverse DND processor 350 extends the range of the differential data to a positive number region by performing an inverse divide-down operation, in step S4340.

In a preferred embodiment of the present invention, an inverse divide-down operation which is defined by the following equation may be used.

$$\text{inverse-divide-down}(v) = v \quad (\text{if } v \geq 0) \quad (16)$$
$$= (nKeyMax_i + 1) + \frac{v-1}{2} \quad (\text{if } v < 0, v \bmod 2 \neq 0)$$
$$= \frac{v}{2} \quad (\text{if } v < 0, v \bmod 2 = 0)$$

If nKeyMax is not smaller than 0 and the order of inverse DND is 1, the inverse DND processor 350 completes an entire inverse DND operation after performing an inverse divide operation in step S4350. In a preferred embodiment of the present invention, an inverse divide operation which is defined by Equation (17) may be used.

$$\text{inverse-divide}(v) = v \quad (\text{if } v \geq 0) \quad (17)$$
$$= v + (nKeyMax_0 + 1) \quad (\text{if } v < 0)$$

The differential data of key data which have been through the inverse DND operation are input into the inverse folding processor 340, and the inverse folding processor 340 performs an inverse folding operation on the differential data so that the differential data which used to be only in a positive number region are divided into positive values and negative values in step S4400. In a preferred embodiment of the present invention, an inverse folding operation which is defined by Equation (18) may be used.

$$\text{inverse-fold}(v) = -\frac{v+1}{2} \quad (\text{if } v \bmod 2 \neq 0) \quad (18)$$
$$= \frac{v}{2} \quad (\text{if } v \bmod 2 = 0)$$
$$0 \quad (\text{if } v = 0)$$

The differential data which have been through the inverse folding operation are output to the inverse shifter 330, and the inverse shifter 330 adds a mode nKeyShift, which has been used in the process of encoding and is input from the key header decoder 370, to the differential data input from the inverse folding processor 340, in step S4500. This operation is expressed by the following equation.

$$\text{inverse-shift}(v) = v + n\text{KeyShift} \quad (19)$$

The inverse DPCM processor 320 restores the differential data input from the inverse shifter 330 into quantized key data using the order of DPCM input from the key header encoder 370, in step S4600. The inverse shifter 330 performs an inverse DPCM operation as many times as the order of DPCM following Equation (20).

$$v(i+1) = v(i) + \text{delta}(i) \quad (20)$$

Here, i indicates an index of differential data and key data, v indicates an array of integers, and delta(i) indicates differential data.

The quantized key data having been through the inverse DPCM operation are input into the inverse quantizer 310. Then, the inverse quantizer 310 receives information on whether or not the size nKeyQBit of quantization bits and maximum and minimum values used for inverse quantization are encoded by the floating-point number converter 205 from the key header decoder 370 and converts the quantized key data into inversely quantized key data in step S4700 using the following equation.

$$\text{inverse-quantize}(v) = \quad (21)$$
$$fKeyMin + \frac{v}{2^{nKeyQBit} - 1} \times (fKeyMax - fKeyMin)$$

If maximum and minimum values used for quantization have not been converted by the floating-point number converter 205 in the process of encoding key data, fKeyMin and fKeyMax shown in Equation (21) are set to 0 and 1, respectively. However, if the maximum and minimum values used for quantization have been converted by the floating-point number converter 205, maximum and minimum values which are inversely converted by the floating-point number inverse converter 305 are used as the maximum and minimum values, respectively, for inverse quantization.

An example of program codes into which the inverse DND operation to the inverse quantization are realized will be described later.

The decoded key data output from the inverse quantizer 310 are added to the key data decoded in the linear key decoder 300, thus constituting decoded key data.

Hereinafter, a linear key decoding process will be described in the following.

The key header decoder 370 decodes key header information from a bitstream. If information on a linear key data region exists in the bitstream, the key header decoder 370 outputs information required for decoding the beginning and ending keys of the linear key data region to the floating-point number converter 305 and outputs the number of keys, which are encoded as linear keys, to the linear key decoder 300.

The floating-point number inverse converter 305 inversely converts the beginning and ending keys of the linear key data region, which are expressed by decimal numbers, into binary numbers and outputs the binary numbers to the linear key decoder 300.

Supposing two floating-point numbers to be decoded are referred to as fKeyMin and fKeyMax, a process of decoding fKeyMin is as follows.

The key header decoder 370 reads the number of digits of fKeyMin from a bitstream. If the digit number of fKeyMin is 0, fKeyMin is set to 0, and the number of digits of fKeyMax is read from the bitstream in order to decode fKeyMax. If the digit number of fKeyMax is not smaller than 8, it means that fKeyMax has been encoded following the IEEE Standard 754. Thus, the floating-point number fKeyMax is decoded after 32 bits of it are read.

However, if the digit number of fKeyMax is between 1 and 7, the key header decoder 370 reads a sign bit from the bitstream. In a preferred embodiment of the present invention, if the sign bit is 1, MinKeyMantissaSign is set to −1. On the other hand, if the sign bit is 0, MinKeyMantissaSign is set to 1. Thereafter, the number of bits required for decoding is obtained referring to Table 1 which shows the relationship between the digit number of a mantissa and the number of bits required for encoding. Next, as many bits of the bitstream as the number of bits required for encoding are read and are stored in nMinKeyMantissa. Then, next one bit of the bitstream is read and is stored in MinKeyExponentSign in the same way as the sign of the mantissa is stored in MinKeyMantissaSign. Next six bits of the bitstream, which correspond to an exponent value, are read and are stored in nMinKeyExponent.

The floating-point number inverse converter 305 restores fKeyMin by substituting the value input from the key header decoder 370 into Equation (22).

$$fKeyMin = \frac{MinKeyMantissaSign * nMinKeyMantissa}{10^{MinKeyExponentSign * nMinKeyExponent}} \quad (22)$$

A process of restoring fKeyMax is the same as the process of restoring fKeyMin. In particular, it is determined whether or not the same value as the exponent of fKeyMin is used as the exponent of fKeyMax before reading the exponent of fKeyMax from the bitstream. If the same value as the exponent of fKeyMin is not used as the exponent of fKeyMin, the exponent of fKeyMax is read from the bitstream in the same way the exponent of fKeyMin is read from the bitstream.

The linear key decoder 300 receives the beginning and ending keys of the linear key data region from the floating-point number inverse converter 305 and decodes the linear key data region following Equation (23).

$$Key_i = fKeyMin + \frac{(fKeyMax - fKeyMin) * i}{(nNumberOfLinearKey - 1)} \quad (23)$$
$$(i = 0, \ldots, nNumberOfLinearKey - 1)$$

Here, fKeyMin and fKeyMax indicate the beginning and ending key data, respectively, of the linear key data region.

Key data in the linear key data region decoded using the aforementioned method are added to the key data output from the inverse quantizer 310, and then the results of the adding are output as final key data.

An example of the apparatus for decoding key data according to a preferred embodiment of the present invention has been described above. It is obvious to one skilled in the art that the present invention may be embodied in various ways. Hereinafter, various embodiments of the apparatus for decoding key data will be described with reference to FIGS. 11B through 11E. The same reference numerals in FIGS. 11A through 11E represent the same elements.

Figure 11B:
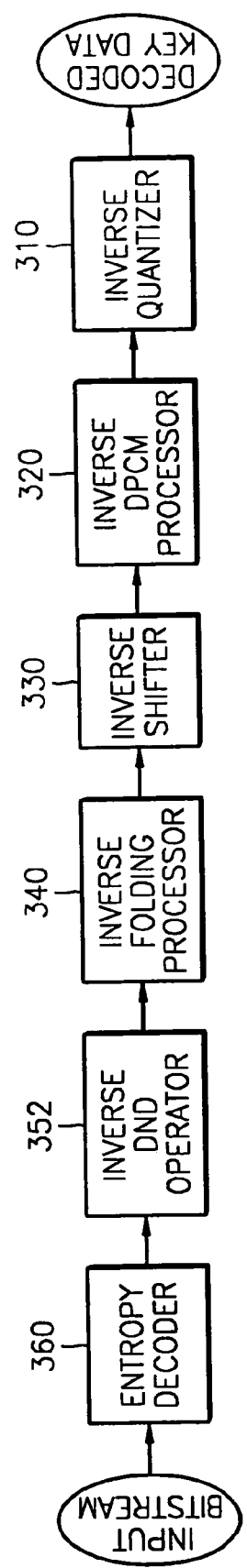
FIGS. 11B through 11E are block diagrams of examples of a key data decoder according to the present invention.

Referring to FIG. 11B, an apparatus for decoding key data according to another preferred embodiment of the present invention includes an entropy decoder 360, an inverse DND operator 352, an inverse folding processor 340, an inverse shifter 330, an inverse DPCM processor 320, and an inverse quantizer 310.

When a bitstream, in which key data are encoded, is input into the apparatus for decoding key data, the entropy decoder 360 entropy-decodes the input bitstream and outputs the results of the entropy decoding, i.e., decoded differential data to the inverse DND operator 352. The inverse DND operator 352 determines whether or not the input differential data have been through a DND operation based on the order of DND regarding the input differential data. If the differential data turn out to have been through a DND operation, the inverse DND operator 352 performs an inverse DND operation on the differential data and outputs the results of the inverse DND operation. If the differential data have not been through a DND operation, the inverse DND operator 352 bypasses them.

The inverse folding processor 340 checks if the differential data input from the inverse DND operator 352 have been through a folding operation using the order of DND and performs an inverse folding operation on the differential data if the differential data have been through a folding operation. If the differential data have not been through a folding operation, the inverse DND operator 352 bypasses them to the inverse shifter 330.

The inverse shifter 330 performs an inverse shifting operation on the differential data input from the inverse folding processor 340 and outputs the results of the inverse shifting operation to the inverse DPCM processor 320. The inverse DPCM processor 320 converts the differential data input from the inverse shifter 330 into quantized key data and outputs the quantized key data to the inverse quantizer 310. The inverse quantizer 310 inversely quantizes the quantized key data and outputs decoded key data.

Figure 11C:
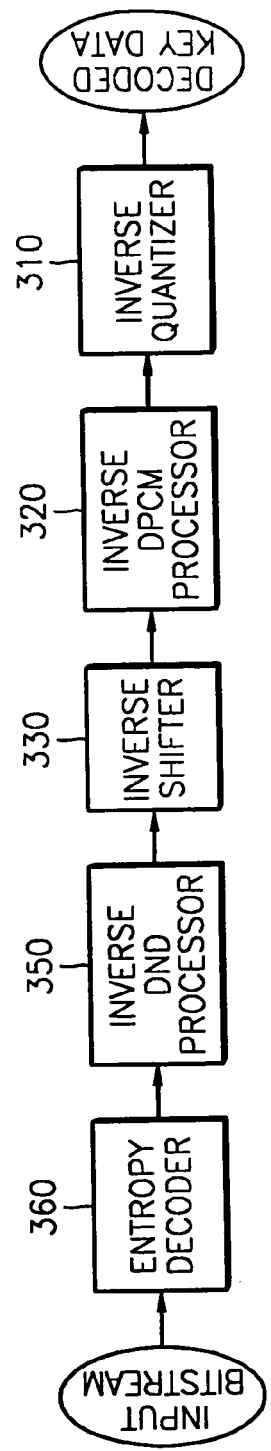

Referring to FIG. 11C, an apparatus for decoding key data according to another preferred embodiment of the present invention includes an entropy decoder 360, an inverse DND processor 350, an inverse shifter 330, an inverse DPCM processor 320, and an inverse quantizer 310.

When a bitstream, in which key data are encoded, is input into the apparatus for decoding key data, the entropy decoder 360 entropy-decodes the input bitstream and outputs decoded differential data to the inverse DND processor 350. The inverse DND processor 350 checks if the differential data input from the entropy decoder 360 have been through a shift-up operation in the process of encoding the key data. If the input differential data have been through a shift-up operation, the inverse DND processor 350 sequentially performs a shift-down operation and an inverse DND operation on the differential data and outputs the results of the inverse DND operation. If the input differential data have not been through a shift-up operation, the inverse DND processor 350 performs an inverse DND operation on the differential data and outputs the results of the inverse DND operation to the inverse shifter 330.

The inverse shifter 330 performs an inverse shifting operation on the differential data input from the inverse DND processor 350 and outputs the results of the inverse shifting operation to the inverse DPCM processor 320. The inverse DPCM processor 320 converts the differential data input from the inverse shifter 330 into quantized key data and outputs the quantized key data to the inverse quantizer 310. The inverse quantizer 310 inversely quantizes the quantized key data and outputs decoded key data.

Figure 11D:
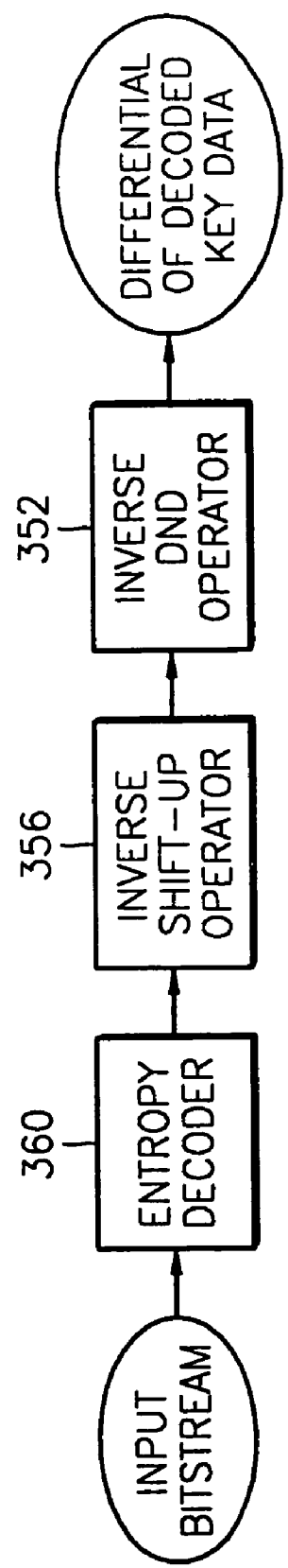

Referring to FIG. 11D, an apparatus for decoding key data according to another preferred embodiment of the present invention includes an entropy decoder 360, an inverse shift-up operator 356, and an inverse DND operator 352.

An input bitstream is decoded in the entropy decoder 360, is converted in differential data, and is input into the inverse shift-up operator 356. The inverse shift-up operator 356 performs a shift-down operation on the input differential data and outputs the results of the shift-down operation to the inverse DND operator 352. The inverse DND operator 352 performs an inverse DND operation on the differential data input from the shift-up operator 356 and outputs differential data of decoded key data. The differential data of decoded key data can be output using a general decoder.

Figure 11E:
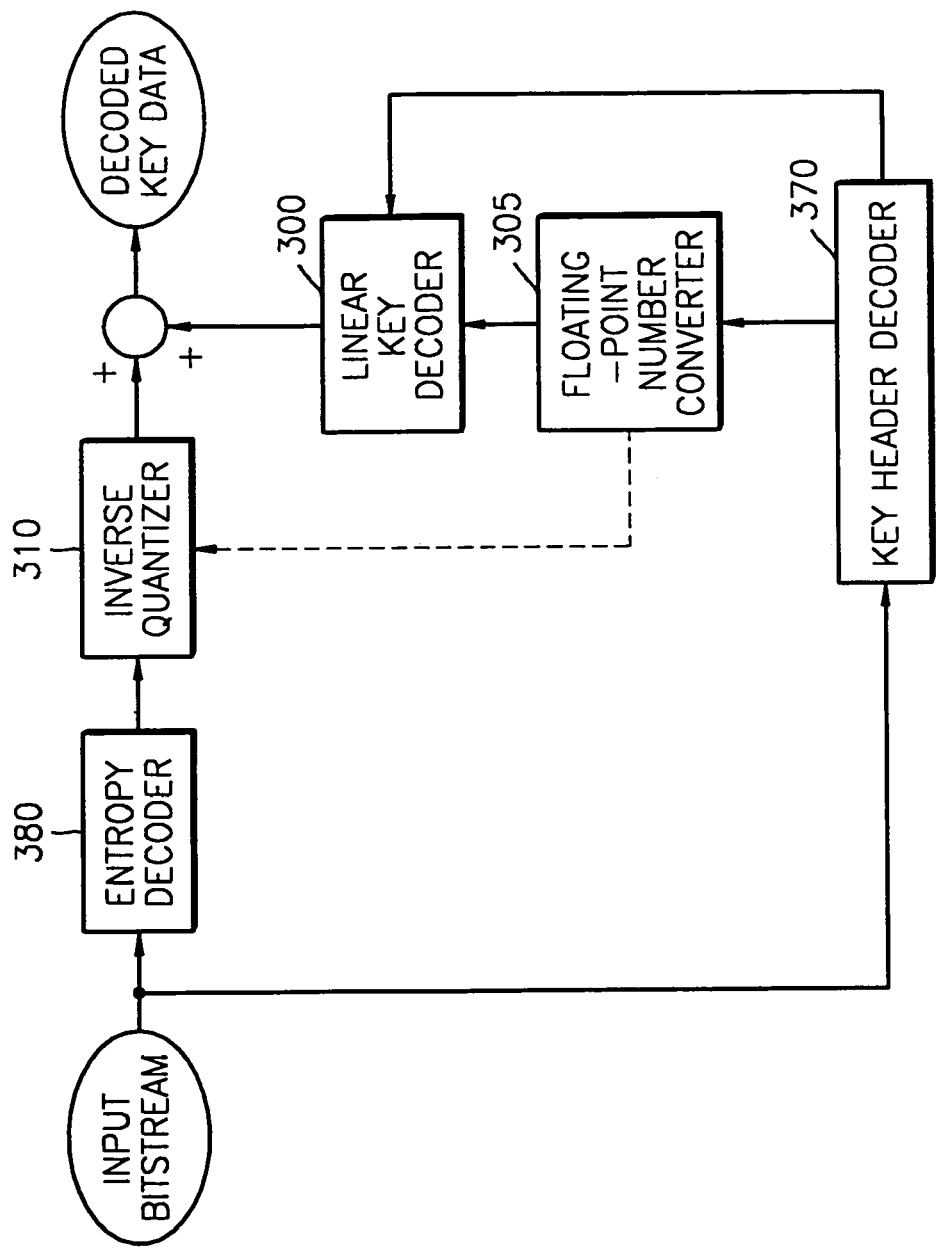

Referring to FIG. 11E, an apparatus for decoding key data according to another preferred embodiment of the present invention decodes a bitstream which has been encoded in an apparatus for encoding key data using a linear key encoder. The apparatus for decoding key data includes an entropy decoder 380, a key header decoder 370, an inverse quantizer 310, and a floating-point number inverse converter 305.

An input bitstream is input into the entropy decoder 380 and the key header decoder 370. The entropy decoder 380 entropy-decodes part of the bitstream corresponding to key data, performs a predetermined operation on it, and outputs the result of the predetermined operation to the inverse quantizer 310. The key header decoder 370 decodes another part of the bitstream corresponding to a key header and outputs the number of key data included in a linear key data region to a linear key decoder. In addition, the key header decoder 370 outputs information on the beginning and ending key data of the linear key data region to the floating-point number inverse converter 305.

The inverse quantizer 310 inversely quantizes quantized key data and outputs the results of the inverse quantization. The linear key decoder decodes the linear key data region using the beginning and ending key data of the linear key data region which are input from the floating-point number inverse converter 305. Next, the linear key decoder adds the decoded linear key data to the key data output from the inverse quantizer 310 and outputs decoded key data.

Examples of program codes, into which operations for decoding key data are realized, will be described in the following with reference to FIGS. 15A through 15C.

FIG. 15A is a diagram illustrating an example of program codes, into which a function decodeSignedAAC( ) for decoding, with the use of a context regarding values and their signs, values having a sign from a bitstream, which has been through adaptive arithmetic encoding, is realized.

FIG. 15B is a diagram illustrating an example of program codes, into which a function decodeUnsignedAAC( ) for decoding, with the use of a context regarding values and their signs, values not having a sign from a bitstream, which has been through adaptive arithmetic encoding, is realized. In FIG. 15B, qf_decode( ) indicates a function for reading one bit from a bitstream.

FIG. 15C is a diagram illustrating an example of program codes, into which the inverse DND operation to the inverse quantization, which have been described above, are realized.

The present invention can be realized as computer-readable codes written on a computer-readable recording medium. Here, the computer-readable recording medium includes any kind of recording medium which can be read by a computer system. For example, the computer-readable recording medium includes a ROM, a RAM, a CD-ROM, a magnetic tape, a floppy disk, an optical data storage, carrier wave (transmission through the Internet). The computer-readable recording medium can be decentralized to computer systems connected over network, and a computer can read the recording medium in a decentralized way.

Unlike conventional apparatuses for encoding and decoding key data, the method and apparatus for encoding and decoding key data according to the present invention can considerably improve the efficiency of encoding key data by performing a shifting operation, a folding operation, and a DND operation on differential data, which are obtained performing a DPCM operation, and encoding the results of one of the operations which can minimize the number of bits required for encoding. Therefore, according to the present invention, it is possible to considerably reduce a space for storing 3D animation and to transmit animation data at high speeds.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of decoding a bitstream into which a coordinate interpolator that comprises key data and a key header comprising information regarding the key data is encoded, the key data representing the position of a key frame on a time axis, the method comprising:
    (a) decoding the key header; and
    (b) decoding the key data according to the result of the decoding performed in (a).

2. The method of claim 1, wherein (b) comprises decoding the key data by performing entropy decoding, inverse shift, inverse differential pulse code modulation (DPCM), inverse quantization, and linear key synthesis.

3. The method of claim 2, wherein the key header comprises:
    a quantization bit quantity (nKVQBit) which indicates the number of bits used to quantize the key data;
    a key data quantity (nNumberOfKey) which indicates the number of the key data;
    a key data digit number (nKeyDigit) which indicates the number of digits of the key data;
    a linear key flag (bIsLinearKeySubRegion) which indicates whether the key data comprises a linear key region;
    beginning/ending key data (IKey) which is included in the key header if the linear key flag (bIsLinearKeySubRegion) is set to a value of 1, the beginning/ending key data (IKey) indicating where the linear key region begins and ends;
    a quantization error adjustment flag (bRangeFlag) which indicates whether to adjust a maximum and minimum of the key data using a method by which a quantization error can be minimized;
    an adjusted maximum and minimum (KeyMinMax) of the key data which are included in the key header if the quantization error adjustment flag (bRangeFlag) is set to a value of 1, the adjusted maximum and minimum (KeyMinMax) being used to perform inverse quantization;
    a DPCM order (nKDPCMOrder) which indicates how many iterations of DPCM which have been performed;
    (nQIntraKey) indicates a size of first quantized intra data and is used as a base for recovering other quantized key data;
    key data sign bits (nQIntraKeySign) represents a sign of (nQIntraKey);
    a shift flag (bShiftFlag) which indicates whether to shift all the key data based on the key data with a highest frequency among all the key data obtained by DPCM;
    a shift value (nKeyShift) which represents the degree to which all the key data is to be shifted;
    a shift value sign bit (nKeyShiftSign) which is a sign bit of the shift value (nKeyShift);
    a divide-and-divide (DND) order (nDNDOrder) which indicates how many iterations of DND have been performed to adjust a range of DPCM results;
    at least one (nKeyMax) of maximums and minimums which are used to perform DND, wherein the number of the maximums and minimums corresponds to the DND order (nDNDOrder);
    a sign bit (nKeyMaxSign) which identifies the at least one (nKeyMax) of the maximums and minimums, wherein the number of the sign bit (nKeyMaxSign) corresponds to the DND order (nDNDOrder);
    an invert-down flag (nKeyInvertDownFlag) which indicates whether to invert down DND results;
    an invert-down value (nKeyInvertDown) which indicates the degree to which the DND results are to be inverted down; and
    an adaptive arithmetic coding (AAC) flag (bSignedAAC-Flag) which indicates whether entropy encoding has been performed using a signed AAC method or an unsigned AAC method,
    wherein the linear key region is a region where the key data linearly increases.

4. The method of claim 3, wherein (b) comprises:
    performing entropy-decoding on the encoded key data by performing inverse signed AAC if the AAC flag (bSignedAACFlag) indicates that the encoded key data has been encoded using the signed AAC method and performing inverse unsigned AAC if the AAC flag (bSignedAACFlag) indicates that the encoded key data has been encoded using the unsigned AAC method;
    performing inverse DND on the result of the entropy decoding if the DND order (nDNDOrder) is set to a value of 1 or greater;
    performing inverse fold on the result of the entropy decoding if the DND order (nDNDOrder) is set to a value other than −1;
    inversely shifting the result of the inverse fold by as much as the shift value (nKeyShift) if the DND order (nDNDOrder) is set to a value other than −1, and inversely shifting the result of the entropy decoding by as much as the shift value (nKeyShift) if the DND order (nDNDOrder) is set to a value of −1;
    performing inverse DPCM on the result of the inversely shifting according to the DPCM order (nKDPCMOrder);
    adjusting the result of the inverse DPCM if the maximum and minimum key data have been adjusted, and performing inverse quantization on the result of the adjusting according to the quantization bit size (nKeyQBit); and
    if the decoded key header comprises the linear key region, decoding the key data of the linear key region using the beginning/ending key data (IKey), and performing linear key synthesis on the result of the decoding and the result of the inverse quantization.

5. The method of claim 4, wherein, in the performing of the inverse DND, if the DND order (nDNDOrder) is set to a value of 1 or greater and the invert-down value is not −1, an invert-down operation, which is an inverse operation of a shift-up operation performed during entropy encoding, is performed, if the DND order (nDNDOrder) is set to a value of 1 or greater and the invert-down value is −1, not performing the invert-down operation, and the performing of the inverse DND comprises performing the inverse DND a predetermined number of times corresponding to the DND order (nDNDOrder), wherein, if a current iteration of the inverse DND is not a final iteration of the inverse DND and the at least one (nKeyMax) is a positive value, the current iteration of the inverse DND is performed using an invert-divide-down method, if the current iteration of the inverse DND is not the final iteration of the inverse DND and the at least one (nKeyMax) is a negative value, the current iteration of the inverse DND is performed using an inverse-divide-up method, and if the current iteration of the inverse DND is the final iteration of the inverse DND, the current iteration of the inverse DND is performed using an inverse-divide-up method regardless of whether the at least one (nKeyMax) is a positive value or a negative value.

6. The method of decoding of claim 1, wherein the key header comprises information about a number of key data and information about a number of digits of each of the key data.

7. A method of encoding a coordinate interpolator that comprises key data and a key header comprising information regarding the key data, the key data representing the position of a key frame on a time axis, the method comprising:
  (a) encoding the key header; and
  (b) encoding the key data according to the result of the encoding performed in (a).

8. The method of claim 7, wherein (b) comprises encoding the key data by performing quantization, differential pulse code modulation (DPCM), and entropy encoding.

9. The method of claim 8, wherein the key header comprises:
  a quantization bit quantity (nKVQBit) which indicates the number of bits used to quantize the key data;
  a key data quantity (nNumberOfKey) which indicates the number of the key data;
  a key data digit number (nKeyDigit) which indicates the number of digits of the key data;
  a linear key flag (bIsLinearKeySubRegion) which indicates whether the key data comprises a linear key region;
  beginning/ending key data (IKey) which is included in the key header if the linear key flag (bIsLinearKeySubRegion) is set to a value of 1, the beginning/ending key data (IKey) indicating where the linear key region begins and ends;
  a quantization error adjustment flag (bRangeFlag) which indicates whether to adjust a maximum and minimum of the key data using a method by which a quantization error can be minimized;
  an adjusted maximum and minimum (KeyMinMax) of the key data which are included in the key header if the quantization error adjustment flag (bRangeFlag) is set to a value of 1, the adjusted maximum and minimum (KeyMinMax) being used to perform quantization;
  a DPCM order (nKDPCMOrder) which indicates how many iterations of DPCM which have been performed;
  (nQIntraKey) indicates a size of first quantized intra data and is used as a base for recovering other quantized key data;
  key data sign bits (nQIntraKeySign) represents a sign of (nQIntraKey);
  a shift flag (bShiftFlag) which indicates whether to shift all the key data based on the key data with a highest frequency among all the key data obtained by DPCM;
  a shift value (nKeyShift) which represents the degree to which all the key data is to be shifted;
  a shift value sign bit (nKeyShiftSign) which is a sign bit of the shift value (nKeyShift);
  a divide-and-divide (DND) order (nDNDOrder) which indicates how many iterations of DND have been performed to adjust a range of DPCM results;
  at least one (nKeyMax) of maximums and minimums which are used to perform DND, wherein the number of the maximums and minimums corresponds to the DND order (nDNDOrder);
  a sign bit (nKeyMaxSign) which identifies the at least one (nKeyMax) of the maximums and minimums, wherein the number of the sign bit (nKeyMaxSign) corresponds to the DND order (nDNDOrder);
  an invert-down flag (bKeyInvertDownFlag) which indicates whether to invert down DND results;
  an invert-down value (nKeyInvertDown) which indicates the degree to which the DND results are to be inverted down; and
  an adaptive arithmetic coding (AAC) flag (bSignedAACFlag) which indicates whether entropy encoding has been performed using a signed AAC method or an unsigned AAC method,
  wherein the linear key region is a region where the key data linearly increases.

10. The method of claim 9, wherein (b) comprises:
  performing quantization on the key data according to the quantization bit size (nKeyQBit);
  generating differential data by performing DPCM on the result of the quantization according to the DPCM order (nKDPCMOrder);
  performing DND on the differential data so that a difference between a maximum and minimum of the differential data can be minimized; and
  performing entropy encoding on the result of the DND.

11. The method of encoding of claim 7, wherein the key header comprises information about a number of key data and information about a number of digits of each of the key data.

12. An apparatus for decoding a bitstream into which a coordinate interpolator that comprises key data and a key header comprising information regarding the key data is encoded, the key data representing the position of a key frame on a time axis, the apparatus comprising:
  a key header decoding unit which decodes the key header; and
  a key decoding unit which decodes the key data according to the result of the decoding performed by the key header decoding unit.

13. The apparatus of claim 12, wherein the key decoding unit decodes the key data by performing entropy decoding, inverse shift, inverse differential pulse code modulation (DPCM), inverse quantization, and linear key synthesis.

14. The apparatus of claim 13, wherein the key header comprises:
  a quantization bit quantity (nKVQBit) which indicates the number of bits used to quantize the key data;
  a key data quantity (nNumberOfKey) which indicates the number of the key data;
  a key data digit number (nKeyDigit) which indicates the number of digits of the key data;
  a linear key flag (bIsLinearKeySubRegion) which indicates whether the key data comprises a linear key region;
  beginning/ending key data (IKey) which is included in the key header if the linear key flag (bIsLinearKeySubRegion) is set to a value of 1, the beginning/ending key data (IKey) indicating where the linear key region begins and ends;

a quantization error adjustment flag (bRangeFlag) which indicates whether to adjust a maximum and minimum of the key data using a method by which a quantization error can be minimized;

an adjusted maximum and minimum (KeyMinMax) of the key data which are included in the key header if the quantization error adjustment flag (bRangeFlag) is set to a value of 1, the adjusted maximum and minimum (KeyMinMax) being used to perform inverse quantization;

a DPCM order (nKDPCMOrder) which indicates how many iterations of DPCM which have been performed;

(nQIntraKey) indicates a size of first quantized intra data and is used as a base for recovering other quantized key data;

key data sign bits (nQIntraKeySign) represents a sign of (nQIntraKey);

a shift flag (bShiftFlag) which indicates whether to shift all the key data based on the key data with a highest frequency among all the key data obtained by DPCM;

a shift value (nKeyShift) which represents the degree to which all the key data is to be shifted;

a shift value sign bit (nKeyShiftSign) which is a sign bit of the shift value (nKeyShift);

a divide-and-divide (DND) order (nDNDOrder) which indicates how many iterations of DND have been performed to adjust a range of DPCM results;

at least one (nKeyMax) of maximums and minimums which are used to perform DND, wherein the number of the maximums and minimums corresponds to the DND order (nDNDOrder);

a sign bit (nKeyMaxSign) which identifies the at least one (nKeyMax) of the maximums and minimums, wherein the number of the sign bit (nKeyMaxSign) corresponds to the DND order (nDNDOrder);

an invert-down flag (bKeyInvertDownFlag) which indicates whether to invert down DND results;

an invert-down value (nKeyInvertDown) which indicates the degree to which the DND results are to be inverted down; and an adaptive arithmetic coding (AAC) flag (bSignedAACFlag) which indicates whether entropy encoding has been performed using a signed AAC method or an unsigned AAC method, wherein the linear key region is a region where the key data linearly increases.

15. The apparatus of claim 14, wherein the key decoding unit comprises:
an entropy decoding unit which performs entropy-decoding on the encoded key data by performing inverse signed AAC if the AAC flag (bSignedAACFlag) indicates that the encoded key data has been encoded using the signed MC method and performs inverse unsigned AAC if the AAC flag (bSignedAACFlag) indicates that the encoded key data has been encoded using the unsigned AAC method;

an inverse DND unit which performs inverse DND on the result of the entropy decoding performed by the entropy decoding unit if the DND order (nDNDOrder) is set to a value of 1 or greater;

an inverse fold unit which performs inverse fold on the result of the entropy decoding performed by the entropy decoding unit if the DND order (nDNDOrder) is set to a value other than −1;

an inverse shift unit which inversely shifts the result of the inverse fold performed by the inverse fold unit by as much as the shift value (nKeyShift) if the DND order (nDNDOrder) is set to a value other than −1, and inversely shifts the result of the entropy decoding performed by the entropy decoding unit by as much as the shift value (nKeyShift) if the DND order (nDNDOrder) is set to a value of −1;

an inverse DPCM unit which performs inverse DPCM on the result of the inversely shifting performed by the inverse shift unit according to the DPCM order (nKDPCMOrder);

an inverse quantization unit which adjusts the result of the inverse DPCM performed by the inverse DPCM unit if the maximum and minimum key data have been adjusted, and performs inverse quantization on the result of the adjusting according to the quantization bit size (nKeyQBit); and a linear key synthesis unit which, if the decoded key header comprises the linear key region, decodes the key data of the linear key region using the beginning/ending key data (IKey), and performs linear key synthesis on the result of the decoding and the result of the inverse quantization performed by the inverse quantization, unit.

16. The apparatus of claim 15, wherein, if the DND order (nDNDOrder) is set to a value of 1 or greater and the invert-down value is not −1, an invert-down operation, which is an inverse operation of a shift-up operation performed during entropy encoding, is performed, if the DND order (nDNDOrder) is set to a value of 1 or greater and the invert-down value is −1, the invert-down operation is not performed, and the inverse DND is performed a predetermined number of times corresponding to the DND order (nDNDOrder), wherein, if a current iteration of the inverse DND is not a final iteration of the inverse DND and the at least one (nKeyMax) is a positive value, the current iteration of the inverse DND is performed using an invert-divide-down method, if the current iteration of the inverse DND is not the final iteration of the inverse DND and the at least one (nKeyMax) is a negative value, the current iteration of the inverse DND is performed using an inverse-divide-up method, and if the current iteration of the inverse DND is the final iteration of the inverse DND, the current iteration of the inverse DND is performed using an inverse-divide-up method regardless of whether the at least one (nKeyMax) is a positive value or a negative value.

17. The apparatus for decoding of claim 12, wherein the key header comprises information about a number of key data and information about a number of digits of each of the key data.

18. An apparatus for encoding a coordinate interpolator that comprises key data and a key header comprising information regarding the key data is encoded, the key data representing the position of a key frame on a time axis, the apparatus comprising:
a key header encoding unit which encodes the key header; and
a key encoding unit which encodes the key data according to the result of the encoding performed by the key header encoding unit.

19. The apparatus of claim 18, wherein the key encoding unit encodes the key data by performing quantization, differential pulse code modulation (DPCM) and entropy encoding.

20. The apparatus of claim 19, wherein the key header comprises:
a quantization bit quantity (nKVQBit) which indicates the number of bits used to quantize the key data;
a key data quantity (nNumberOfKey) which indicates the number of the key data;
a key data digit number (nKeyDigit) which indicates the number of digits of the key data;

a linear key flag (bIsLinearKeySubRegion) which indicates whether the key data comprises a linear key region;

beginning/ending key data (IKey) which is included in the key header if the linear key flag (bIsLinearKeySubRegion) is set to a value of 1, the beginning/ending key data (IKey) indicating where the linear key region begins and ends;

a quantization error adjustment flag (bRangeFlag) which indicates whether to adjust a maximum and minimum of the key data using a method by which a quantization error can be minimized;

an adjusted maximum and minimum (KeyMinMax) of the key data which are included in the key header if the quantization error adjustment flag (bRangeFlag) is set to a value of 1, the adjusted maximum and minimum (KeyMinMax) being used to perform quantization;

a DPCM order (nKDPCMOrder) which indicates how many iterations of DPCM which have been performed;

(nQIntraKey) indicates a size of first quantized intra data and is used as a base for recovering other quantized key data;

key data sign bits (nQIntraKeySign) represents a sign of (nQIntraKey);

a shift flag (bShiftFlag) which indicates whether to shift all the key data based on the key data with a highest frequency among all the key data obtained by DPCM;

a shift value (nKeyShift) which represents the degree to which all the key data is to be shifted;

a shift value sign bit (nKeyShiftSign) which is a sign bit of the shift value (nKeyShift);

a divide-and-divide (DND) order (nDNDOrder) which indicates how many iterations of DND have been performed to adjust a range of DPCM results;

at least one (nKeyMax) of maximums and minimums which are used to perform DND, wherein the number of the maximums and minimums corresponds to the DND order (nDNDOrder);

a sign bit (nKeyMaxSign) which identifies the at least one (nKeyMax) of the maximums and minimums, wherein the number of the sign bit (nKeyMaxSign) corresponds to the DND order (nDNDOrder);

an invert-down flag (bKeyInvertDownFlag) which indicates whether to invert down DND results;

an invert-down value (nKeyInvertDown) which indicates the degree to which the DND results are to be inverted down; and an adaptive arithmetic coding (AAC) flag (bSignedAACFlag) which indicates whether entropy encoding has been performed using a signed AAC method or an unsigned AAC method, wherein the linear key region is a region where the key data linearly increases.

21. The apparatus of claim 20, wherein the key encoding unit comprises:

a quantization unit which performs quantization on the key data according to the quantization bit size (nKeyQBit);

a DPCM unit which generates differential data by performing DPCM on the result of the quantization performed by the quantization unit according to the DPCM order (nKDPCMOrder);

a DND unit which performs DND on the differential data so that a difference between a maximum and minimum of the differential data can be minimized; and an entropy encoding unit which performs entropy encoding on the result of the DND performed by the DND unit.

22. The apparatus for encoding of claim 18, wherein the key header comprises information about a number of key data and information about a number of digits of each of the key data.

* * * * *

UNITED STATES PATENT AND TRADEMARK OFFICE
CERTIFICATE OF CORRECTION

PATENT NO. : 7,746,249 B2
APPLICATION NO. : 11/390337
DATED : June 29, 2010
INVENTOR(S) : Shin-jun Lee et al.

It is certified that error appears in the above-identified patent and that said Letters Patent is hereby corrected as shown below:

Column 34, Line 19 delete "(nKeyInvertDownFlag)" and insert --(bKeyInvertDownFlag)--.

Column 37, Line 53 delete "MC" and insert --AAC--.

Signed and Sealed this

Thirtieth Day of November, 2010

David J. Kappos
*Director of the United States Patent and Trademark Office*